(12) United States Patent
Watanabe

(10) Patent No.: US 11,508,432 B2
(45) Date of Patent: Nov. 22, 2022

(54) SEMICONDUCTOR STORAGE DEVICE INCLUDING IDENTIFYING PATTERNS AT POSITIONS CORRESPONDING TO MEMORY BLOCKS

(71) Applicant: KIOXIA CORPORATION, Tokyo (JP)

(72) Inventor: Mineo Watanabe, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 49 days.

(21) Appl. No.: 17/006,627

(22) Filed: Aug. 28, 2020

(65) Prior Publication Data

US 2021/0295899 A1 Sep. 23, 2021

(30) Foreign Application Priority Data

Mar. 17, 2020 (JP) .............. JP2020-046404

(51) Int. Cl.
*G11C 11/4097* (2006.01)
*G11C 11/4094* (2006.01)
*H01L 23/00* (2006.01)
*G11C 5/06* (2006.01)
*G11C 5/02* (2006.01)

(52) U.S. Cl.
CPC .......... *G11C 11/4097* (2013.01); *G11C 5/025* (2013.01); *G11C 5/06* (2013.01); *G11C 11/4094* (2013.01); *H01L 24/80* (2013.01)

(58) Field of Classification Search
CPC ....... G11C 11/4097; G11C 5/025; G11C 5/06; H01L 24/80
See application file for complete search history.

(56) References Cited

U.S. PATENT DOCUMENTS

| | | | | |
|---|---|---|---|---|
| 6,256,604 B1* | 7/2001 | Yabe | .................... | G11C 7/1006 |
| | | | | 716/120 |
| 6,274,895 B1* | 8/2001 | Fujii | .................. | G11C 11/4097 |
| | | | | 257/E23.151 |
| 2007/0206419 A1* | 9/2007 | Makino | .................. | G11C 5/025 |
| | | | | 365/185.11 |
| 2018/0047744 A1 | 2/2018 | Utsumi | | |
| 2020/0266144 A1 | 8/2020 | Ichikawa et al. | | |
| 2021/0202457 A1* | 7/2021 | Choi | ................. | G11C 16/0483 |

FOREIGN PATENT DOCUMENTS

JP 2018026518 A 2/2018

* cited by examiner

*Primary Examiner* — Tuan T Nguyen

(74) *Attorney, Agent, or Firm* — Kim & Stewart LLP

(57) ABSTRACT

According to one or more embodiments, a semiconductor storage device includes a first chip and a second chip. The first chip includes a semiconductor substrate and a plurality of transistors on the semiconductor substrate. The second chip includes a memory cell array and a plurality of first patterns. The memory cell array is connected to the plurality of transistors of the first chip and includes a plurality of memory blocks arranged in a first direction. The plurality of first patterns are spaced from each other in the first direction. Each first pattern represents a different number and is at a position corresponding to one or more of the memory blocks.

6 Claims, 19 Drawing Sheets

SEMICONDUCTOR STORAGE DEVICE INCLUDING IDENTIFYING PATTERNS AT POSITIONS CORRESPONDING TO MEMORY BLOCKS

CROSS-REFERENCE TO RELATED APPLICATION(S)

This application is based upon and claims the benefit of priority from Japanese Patent Application No. 2020-046404, filed Mar. 17, 2020, the entire contents of which are incorporated herein by reference.

FIELD

Embodiments described herein relate generally to a semiconductor storage device.

BACKGROUND

A semiconductor storage device including a first chip and a second chip which are bonded to each other is known. The first chip includes a semiconductor substrate and a plurality of transistors on the semiconductor substrate. The second chip includes a memory cell array connected to the plurality of transistors.

DETAILED DESCRIPTION

Figure 1:
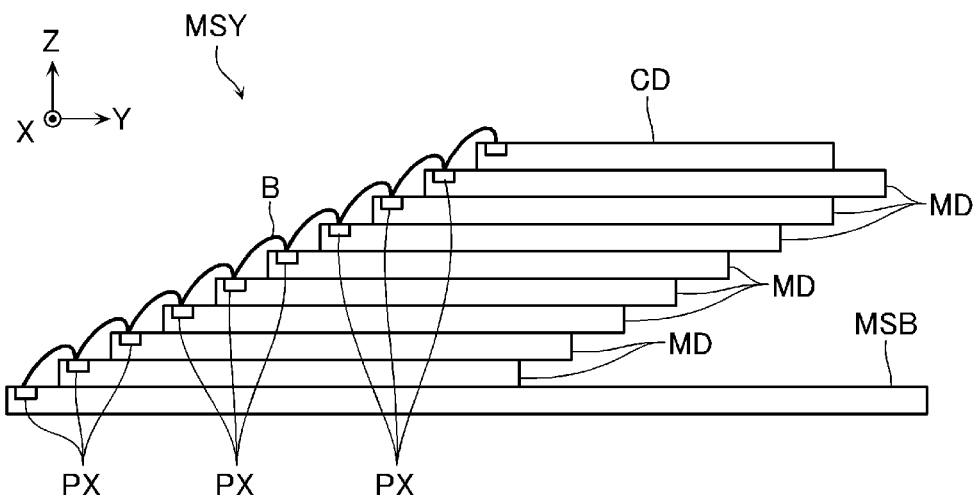
FIG. 1 depicts a semiconductor storage device in a schematic side view according to a first embodiment.

According to one or more embodiments, a semiconductor storage device comprises a first chip and a second chip. The first chip includes a semiconductor substrate and a plurality of transistors on the semiconductor substrate. The second chip includes a memory cell array and a plurality of first patterns. The memory cell array is connected to the plurality of transistors and includes a plurality of memory blocks arranged in a first direction. The plurality of first patterns are spaced from each other in the first direction. Each first pattern represents a different number and is at a position corresponding to one or more of the memory blocks.

According to further one or more embodiments, a semiconductor storage device includes a first chip and a second chip. The first chip includes a semiconductor substrate and a plurality of transistors on the semiconductor substrate. The second chip includes a memory cell array and a wiring layer. The memory cell array is connected to a plurality of transistors and includes a plurality of memory blocks arranged in a first direction. The wiring layer has a smaller distance from the semiconductor substrate than the memory cell array and includes a plurality of wirings extending in the first direction and arranged in a second direction intersecting the first direction. At least one of the first chip and the second chip includes a plurality of second patterns corresponding to one or more of the wirings and located at positions different from each other in the second direction. The plurality of second patterns are different from each other.

Next, a semiconductor storage device according to embodiments will be described with reference to drawings. The following embodiments are merely examples and are not intended to limit the present disclosure.

In the specification, one direction parallel to a surface of a semiconductor substrate is referred to as an X direction, another direction parallel to the surface of the semiconductor substrate and perpendicular to the X direction is referred to as a Y direction, and a direction orthogonal to the surface of the semiconductor substrate is referred to as a Z direction.

In the specification, a direction along a predetermined plane may be referred to as a first direction, another direction along the predetermined plane and intersecting the first direction may be referred to as a second direction, and a direction intersecting the predetermined plane may be referred to as a third direction. The first direction, the second direction, and the third direction may or may not correspond to any one of the X direction, the Y direction, and the Z direction.

Herein, expressions such as "upper" and "lower" are used taking the semiconductor substrate as a reference. For example, a direction away from the semiconductor substrate along the Z direction may be referred to as "upward" or "upper," and a direction approaching the semiconductor substrate along the Z direction may be referred to as "downward" or "lower." For some example configurations, references to a lower surface or a lower end portion means a surface or an end portion of component or layer that is on a semiconductor substrate facing side or the like of that configuration, and when referring to an upper surface or an upper end portion, it means a surface or an end portion on a side opposite to (or facing away from) the semiconductor substrate of that configuration. In general, any surface intersecting the X direction or the Y direction can be referred to as a side surface.

Herein, when a first aspect is referred to as "electrically insulated" from a second aspect, it means the first and second aspects are in a state in which, for example, an insulating film or the like is provided between the first configuration and the second configuration, without electrical contact, wiring, or the like connecting the first aspect and the second aspect.

In the specification, when referring to a term "electric field effect type transistor" or "electric field effect transistor", this means a transistor including a semiconductor layer functioning as a channel region, agate insulating film, and a gate electrode.

First Embodiment

A configuration of a semiconductor storage device according to a first embodiment will be described below with reference to the drawings. The following drawings are schematic, and some aspects may be omitted for convenience of description.

[Memory System MSY]

Figure 2:
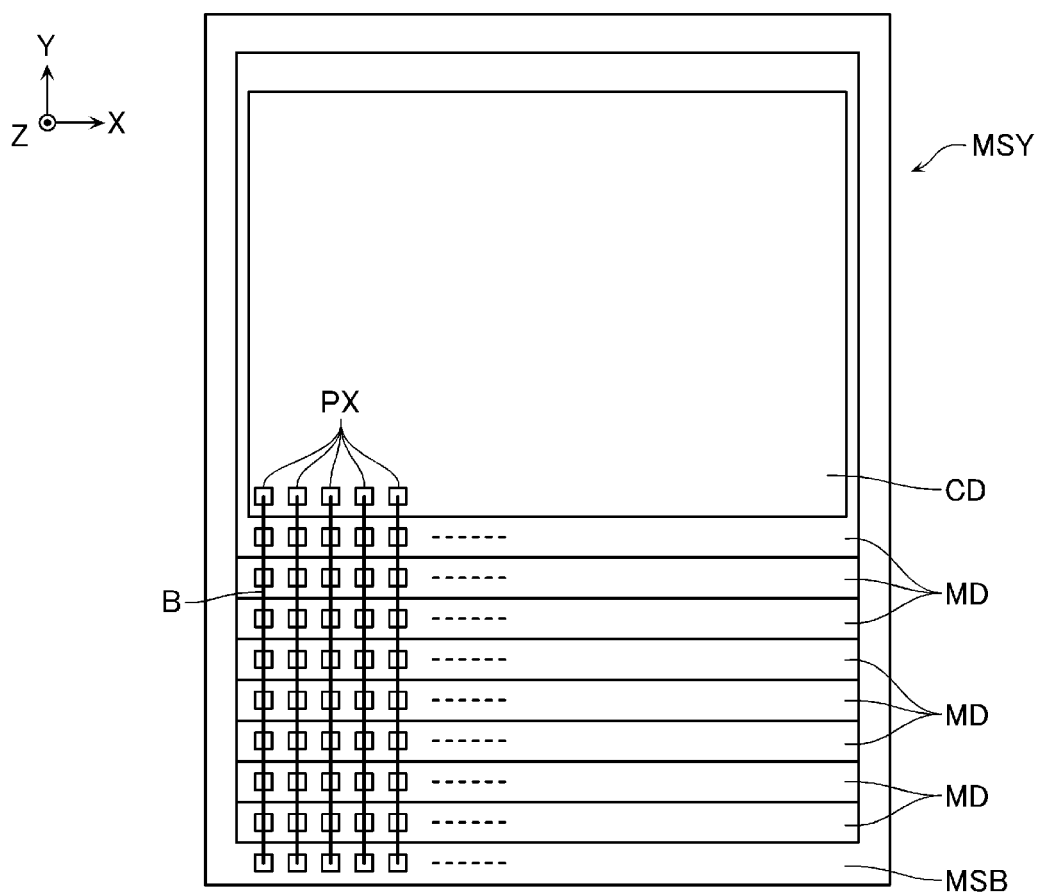
FIG. 2 depicts a semiconductor storage device in a schematic plan view according to a first embodiment.

FIG. 1 is a schematic side view showing a configuration example of the semiconductor storage device according to the first embodiment. FIG. 2 is a schematic plan view showing a configuration example of the semiconductor storage device according to the first embodiment.

As shown in FIG. 1, the memory system MSY according to the first embodiment includes a mounting substrate MSB, a plurality of memory dies MD stacked on the mounting substrate MSB, and a control die CD stacked on the memory dies MD. The plurality of memory dies MD and the control die CD are stacked on each other while being shifted or displaced in the Y direction in a manner where external pad electrodes PX formed on upper surfaces thereof are exposed. The adjacent memory dies MD and control die CD are bonded to each other via an adhesive or the like.

As shown in FIG. 2, each of the mounting substrate MSB, the plurality of memory dies MD, and the control die CD includes a plurality of external pad electrodes PX. The plurality of external pad electrodes PX provided on the mounting substrate MSB, the plurality of memory dies MD, and the control die CD are connected to each other via bonding wires B.

The memory system MSY is, for example, a memory chip, a memory card, or another system capable of storing user data.

The memory die MD stores user data or the like. The plurality of memory dies MD execute a read operation, a write operation, an erase operation, and the like on the user data according to a control signal of the control die CD.

The control die CD includes, for example, a processor, a RAM, a ROM, and the like and performs processing such as a conversion between a logical address and a physical address, bit error detection/correction, and wear leveling. The control die CD is connected to the plurality of memory dies MD, a host computer, and the like.

[Configuration of Memory Dies MD]

Figure 3:
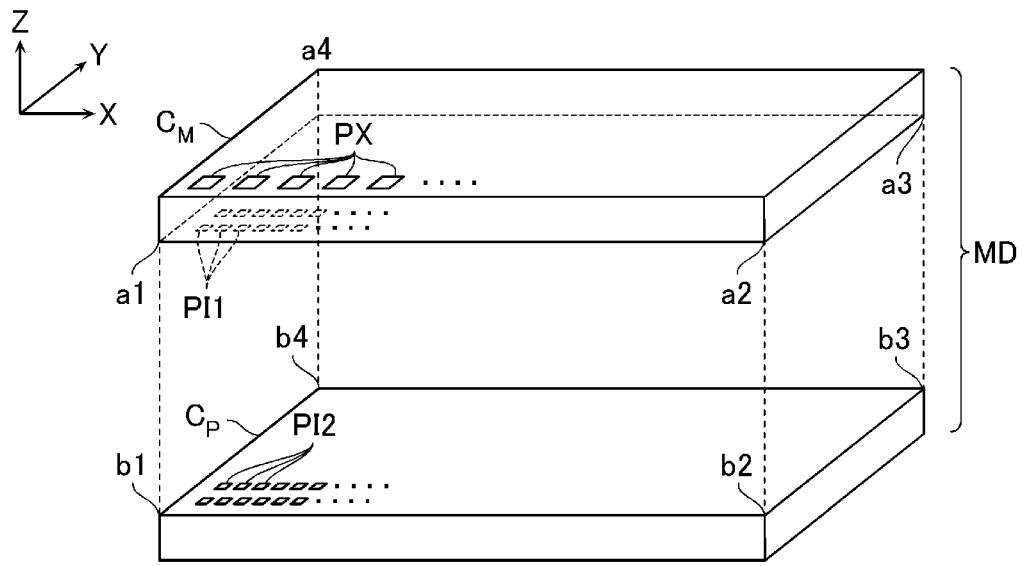
FIG. 3 depicts a semiconductor storage device in a schematic perspective view according to a first embodiment.

FIG. 3 is a schematic perspective view showing a configuration example of the semiconductor storage device according to the first embodiment. As shown in FIG. 3, the memory dies MD each include a chip $C_M$ on a memory cell array side and a chip $C_P$ on a peripheral circuit side.

Hereinafter, in the chip $C_M$, a surface on which a plurality of first bonding electrodes PI1 are provided is referred to as a front surface, and a surface on which the plurality of external pad electrodes PX are provided is referred to as a back surface. In the chip $C_P$, a surface on which a plurality of second bonding electrodes PI2 are provided is referred to as a front surface, and a surface on a side opposite to the front surface is referred to as a back surface. The front surface of the chip $C_P$ is provided above the back surface of the chip $C_P$, and the back surface of the chip $C_M$ is provided above the front surface of the chip $C_M$.

The chip $C_M$ and the chip $C_P$ are arranged in a manner that the front surface of the chip $C_M$ and the front surface of the chip $C_P$ face each other. The plurality of external pad electrodes PX are provided on the back surface of the chip $C_M$, and the plurality of first bonding electrodes PI1 are provided on the front surface of the chip $C_M$. The plurality of second bonding electrodes PI2 are provided on the front surface of the chip $C_P$. The plurality of first bonding electrodes PI1 are provided corresponding to the plurality of second bonding electrodes PI2, respectively, and are arranged at positions where they can be bonded to the plurality of second bonding electrodes PI2. The first bonding electrodes PI1 and the second bonding electrodes PI2 function as bonding electrodes for bonding and electrically connecting the chip $C_M$ and the chip $C_P$ to each other. The first bonding electrode PI1 and the second bonding electrode PI2 include, for example, a conductive material such as copper (Cu).

In an example of FIG. 3, corner portions a1, a2, a3, and a4 of the chip $C_M$ correspond to corner portions b1, b2, b3, and b4 of the chip $C_P$, respectively.

Figure 4:
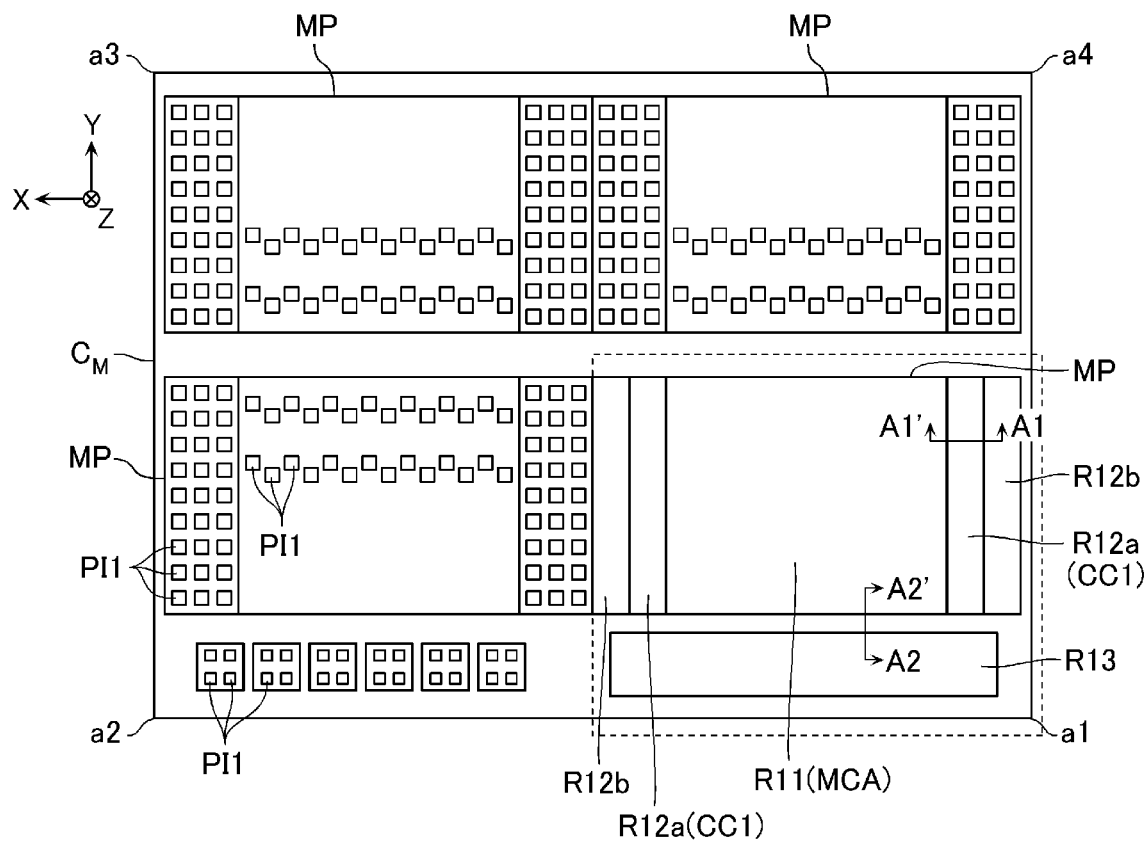
FIG. 4 depicts a semiconductor storage device in a schematic bottom view according to a first embodiment.
Figure 5:
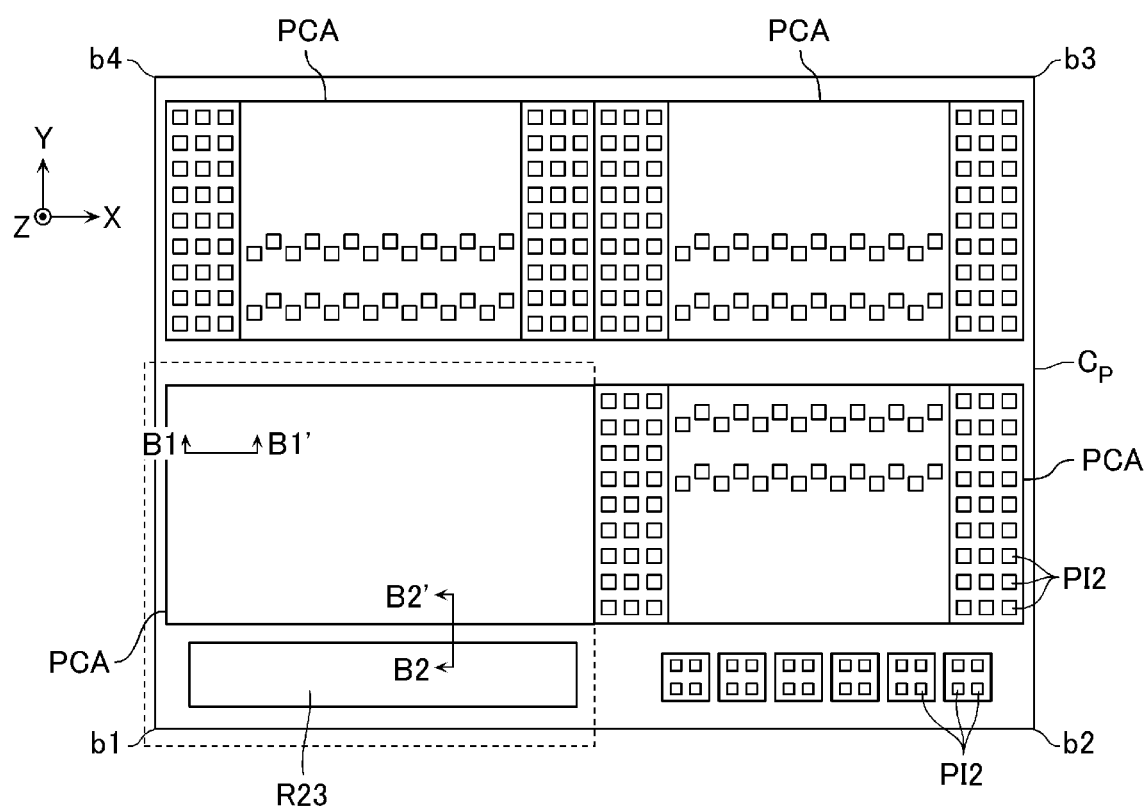
FIG. 5 depicts a semiconductor storage device in a schematic plan view according to a first embodiment.
Figure 6:
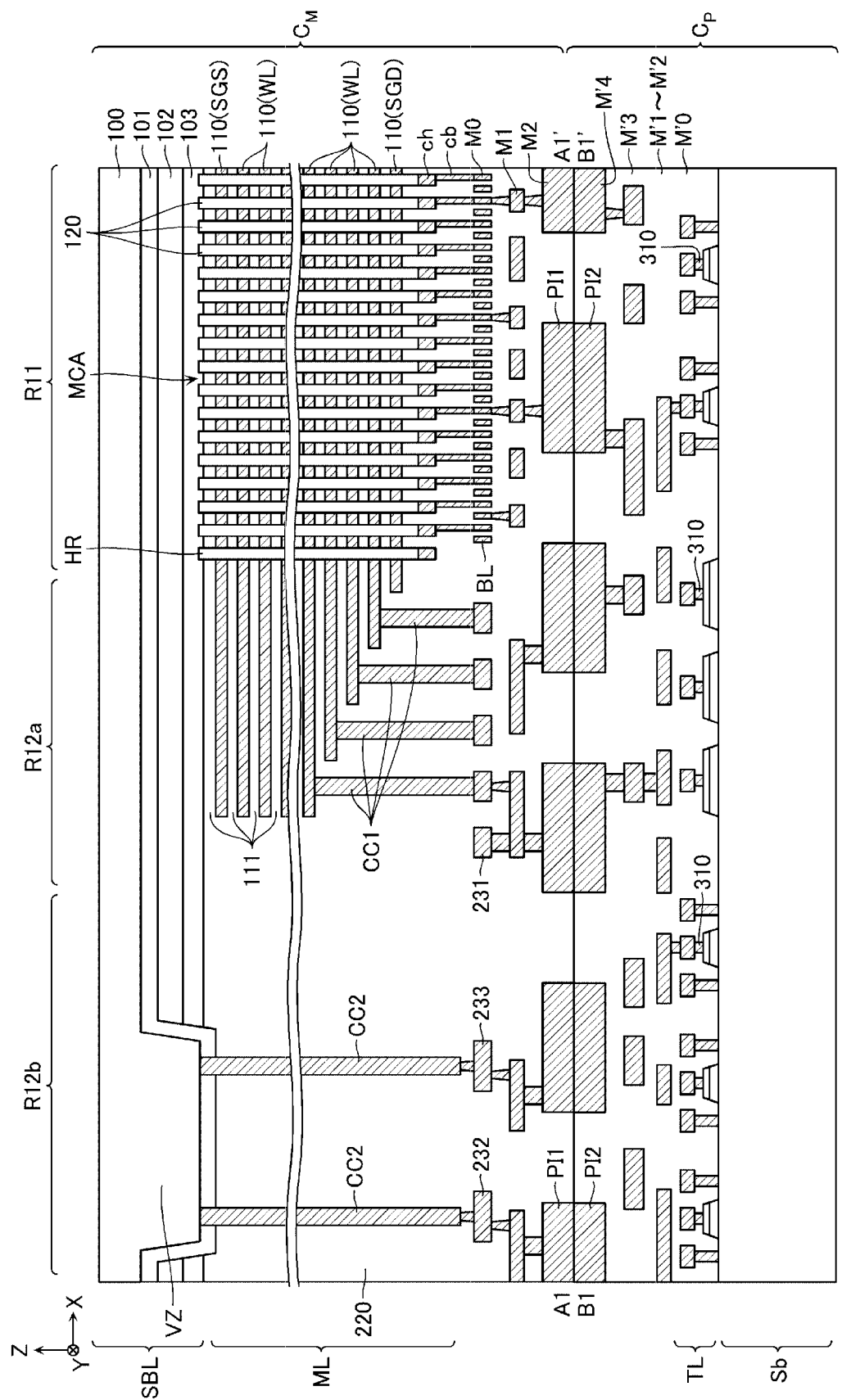
FIG. 6 depicts a semiconductor storage device in a schematic cross-sectional view corresponding to a line A1-A1' in FIG. 4 and a line B1-B1' in FIG. 5 according to a first embodiment.
Figure 7:
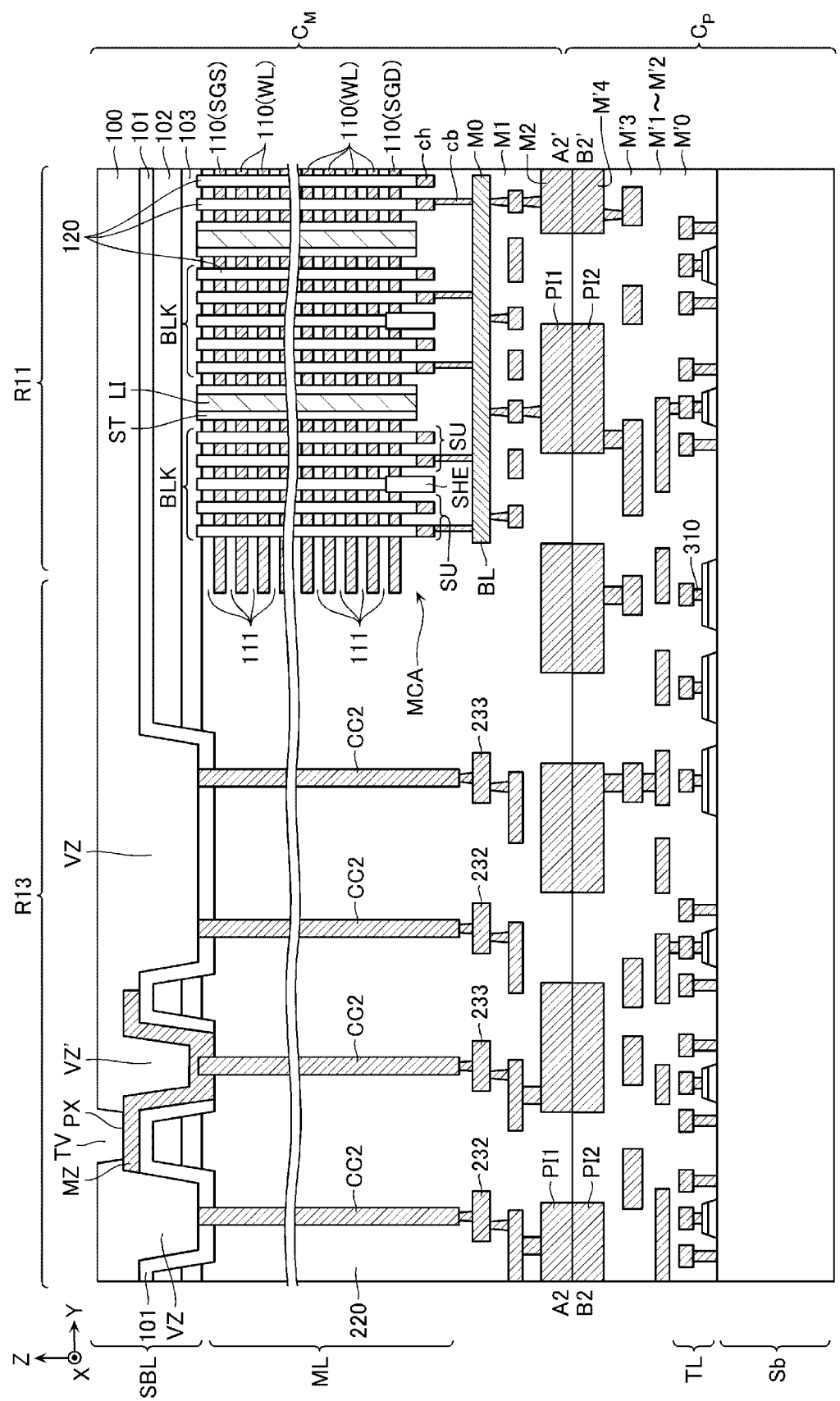
FIG. 7 depicts a semiconductor storage device in a schematic cross-sectional view corresponding to a line A2-A2' in FIG. 4 and a line B2-B2' in FIG. 5 according to a first embodiment.

FIG. 4 is a schematic bottom view showing a configuration example of the chip $C_M$. The part surrounded by dotted lines in lower right of FIG. 4 shows a structure more inside than the front surface of the chip $C_M$ on which the plurality of first bonding electrodes PI1 are provided. FIG. 5 is a schematic plan view showing a configuration example of the chip $C_P$. The part surrounded by dotted lines in lower left of FIG. 5 shows a structure more inside than the front surface of the chip $C_P$ on which the plurality of second bonding electrodes PI2 are provided. FIG. 6 is a schematic cross-sectional view corresponding to a line A1-A1' in FIG. 4 and a line B1-B1' in FIG. 5. FIG. 7 is a schematic cross-sectional view corresponding to a line A2-A2' in FIG. 4 and a line B2-B2' in FIG. 5. FIGS. 6 and 7 show cross sections when the structures shown in FIGS. 4 and 5 are cut along the lines and viewed in directions of arrows.

FIGS. 4 to 7 show a schematic configuration, and details of the configuration may be changed as appropriate.

[Chip $C_M$]

The chip $C_M$ includes four memory planes MP arranged in the X and Y directions, for example, as shown in FIG. 4. Each memory plane MP includes a region R11 in which the memory cell array MCA is provided, a plurality of regions R12a provided on one end side and the other end side in the X direction of the region R11, and a plurality of regions R12b provided on one end side and the other end side in the X direction of the regions R12a. The chip $C_M$ includes a region R13 provided in a region on one end side in the Y direction relative to the four memory planes MP. In the chip $C_M$ and the memory planes MP, the X direction may be a longitudinal direction, or the Y direction may be the longitudinal direction.

As shown in FIGS. 6 and 7, for example, the chip $C_M$ includes a base layer SBL, a memory layer ML provided below the base layer SBL, and a plurality of wiring layers M0, M1 and M2 provided below the memory layer ML.

The base layer SBL includes an insulating layer 100 provided on the back surface of the chip $C_M$, an insulating layer 101 provided below the insulating layer 100, an N-type well layer 102 provided below the insulating layer 101, and a P-type well layer 103 provided below the N-type well layer 102. The insulating layer 100 is, for example, a passivation layer made of an insulating material such as polyimide. The insulating layer 101 is, for example, an insulating layer made of an insulating material such as silicon oxide ($SiO_2$). The N-type well layer 102 is, for example, a semiconductor layer made of silicon (Si) containing an N-type impurity such as phosphorus (P). The P-type well layer 103 is, for example, a semiconductor layer made of silicon (Si) containing a P-type impurity such as boron (B). The N-type well layer 102 and the P-type well layer 103 are divided for each memory plane MP (FIG. 4) by an insulating region VZ.

The base layer SBL includes, for example, a back surface wiring MZ provided in the region R13, as shown in FIG. 7. The back surface wiring MZ is a wiring layer including a conductive material such as aluminum (Al), for example. The back surface wiring MZ is electrically insulated from the N-type well layer 102 and the P-type well layer 103 by the insulating layer 101. A part of the back surface wiring MZ is exposed to an outside of the memory die MD via an opening TV provided in the insulating layer 100, and functions as the external pad electrode PX.

The configuration of the base layer SBL shown in FIGS. and 7 is merely an example, and details of the configuration and the like may be adjusted as appropriate. For example, the base layer SBL may further include a P-type semiconductor region provided between the insulating layer 101 and the N-type well layer 102. For example, the base layer SBL may not include the N-type well layer 102.

In FIGS. 6 and 7, a configuration that is provided in a region where the memory planes MP are divided is exemplified as the insulating region VZ. However, the insulating region VZ may be provided in other regions outside the memory plane MP.

The memory layer ML includes, for example, the memory cell array MCA provided in the region R11, as shown in FIG. 7. The memory cell array MCA includes a plurality of memory blocks BLK arranged in the Y direction. An inter-block insulating layer ST extending in the X direction is provided between each two adjacent memory blocks BLK in the Y direction. Word lines WL in the two memory blocks BLK are electrically insulated by the inter-block insulating layers ST.

Each memory block BLK includes two string units SU arranged in the Y direction, and an inter-string-unit insulating layer SHE provided between the two string units SU.

Each string unit SU includes a plurality of conductive layers 110 provided below the P-type well layer 103, a plurality of semiconductor pillars 120, and gate insulating films provided between the plurality of conductive layers 110 and the plurality of semiconductor pillars 120 respectively.

The conductive layers 110 are a substantially plate-shape conductive layer extending in the X and Y directions and are arranged in the Z direction. Each conductive layer 110 may include, for example, a stacked film of titanium nitride (TiN) and tungsten (W) or may include polycrystalline silicon containing impurities such as phosphorus or boron. Insulation layers 111 such as silicon oxide ($SiO_2$) are provided between the conductive layers 110.

Among the plurality of conductive layers 110, one or more conductive layers 110 positioned at an uppermost position function as source side select gate lines SGS or the like. A plurality of conductive layers 110 positioned on a lower side than the SGS function as the word lines WL or the like. One or more conductive layers 110 positioned on a lower side than the WL function as drain side select gate lines SGD or the like.

The plurality of semiconductor pillars 120 are arranged in the X direction and the Y direction. Each semiconductor pillar 120 is, for example, a semiconductor film such as undoped polycrystalline silicon (Si). Each semiconductor pillar 120 has, for example, a substantially cylindrical shape, and an insulating film such as silicon oxide is provided in a center part thereof. An outer peripheral surface of each semiconductor pillar 120 is surrounded by the conductive layers 110. Each semiconductor pillar 120 functions as a channel region of a plurality of memory cells and a select transistor. An upper end portion of each semiconductor pillar 120 is connected to the P-type well layer 103 via a semiconductor layer such as undoped single crystal silicon. A lower end portion of each semiconductor pillar 120 is connected to each bit line BL via a semiconductor layer including an N-type impurity such as phosphorus (P), a contact ch, and a contact cb.

Each gate insulating film is provided between each semiconductor pillar 120 and each conductive layer 110. The gate insulating film includes, for example, an insulating charge storage film such as silicon nitride (SiN) or a conductive charge storage film such as a floating gate.

A wiring LI is provided inside each inter-block insulating layer ST. The wiring LI may include, for example, a semiconductor containing an N-type impurity such as phosphorus (P) or a P-type impurity such as boron (B), or may include tungsten (W) or the like, or may include silicide or the like. An upper end portion of the wiring LI is connected to the P-type well layer 103. A lower end portion of the wiring LI is connected to wirings in the wiring layer M1 via the contact, the wiring layer M0, and the like.

The memory layer ML includes, for example, a plurality of word line contacts CC1 provided in the regions R12a, as shown in FIG. 6. The word line contacts CC1 include a conductive material such as tungsten (W), for example. The word line contacts CC1 extend in the Z direction. An upper end of each word line contact CC1 is connected to an end portion in the X direction of each conductive layer 110. A lower end of each word line contact CC1 is connected to each wiring 231 in the wiring layer M0. The wirings 231 are connected to the plurality of first bonding electrodes PI1 via the wirings in the wiring layer M1, respectively.

The memory layer ML includes an insulating layer 220 such as silicon oxide provided in the regions R12b, and a plurality of through vias CC2 penetrating through the insulating layer 220.

The plurality of through vias CC2 extend in the Z direction, penetrating through the insulating layer 220. The plurality of through vias CC2 include, for example, a conductive material such as tungsten (W). Upper ends of the plurality of through vias CC2 are in contact with the insulating layer 100 provided in the insulating region VZ. Lower ends of the plurality of through vias CC2 are connected to the plurality of first bonding electrodes PI1 via wirings 232 and 233 in the wiring layer M0, respectively.

The wiring layer M0 is provided below the memory layer ML. The wiring layer M0 is, for example, a wiring layer including a conductive material such as copper (Cu). The wiring layer M0 includes, for example, the bit lines BL and the wirings 231 to 233. The wiring layer M1 is provided below the wiring layer M0. The wiring layer M1 is, for example, a wiring layer including a conductive material such as copper (Cu) or aluminum (Al). The wiring layer M2 is provided below the wiring layer M1. The wiring layer M2 is, for example, a wiring layer including a conductive material such as copper (Cu) and includes the plurality of first bonding electrodes PI1.

[Chip $C_P$]

For example, as shown in FIG. 5, the chip $C_P$ includes four peripheral circuit areas PCA arranged in the X and Y directions corresponding to the memory planes MP of the chip $C_m$. The chip $C_P$ includes a region R23 provided in a region facing the region R13 of the chip $C_m$.

For example, as shown in FIG. 6, the chip $C_P$ includes a semiconductor substrate Sb, a transistor layer TL provided above the semiconductor substrate Sb, and a plurality of wiring layers M'0, M'1, M'2, M'3 and M'4 provided above the transistor layer TL.

The semiconductor substrate Sb is, for example, single crystal silicon (Si) containing a P-type impurity such as boron (B).

The transistor layer TL includes a plurality of transistors 310 provided on a surface of the semiconductor substrate Sb. The plurality of transistors 310 are connected to the elements in the chip $C_P$ via, for example, the second bonding electrodes PI2 and the first bonding electrodes PI1. The plurality of transistors 310 constitute a part of the peripheral circuit connected to the memory cell array MCA.

The wiring layer M'0 is provided above the transistor layer TL. The wiring layer M'0 is, for example, a wiring layer including a conductive material such as tungsten (W). The wiring layer M'1 is provided above the wiring layer M'0. The wiring layer M'1 is, for example, a wiring layer including a conductive material such as copper (Cu). The wiring layer M'2 is provided above the wiring layer M'1. The wiring layer M'2 is, for example, a wiring layer including a conductive material such as copper (Cu). The wiring layer M'3 is, for example, a wiring layer including a conductive material such as copper (Cu) or aluminum (Al). The wiring layer M'4 is, for example, a wiring layer including a conductive material such as copper (Cu) and includes the plurality of second bonding electrodes PI2.

[Example of Chip Layout of Memory Dies MD]

Figure 8:
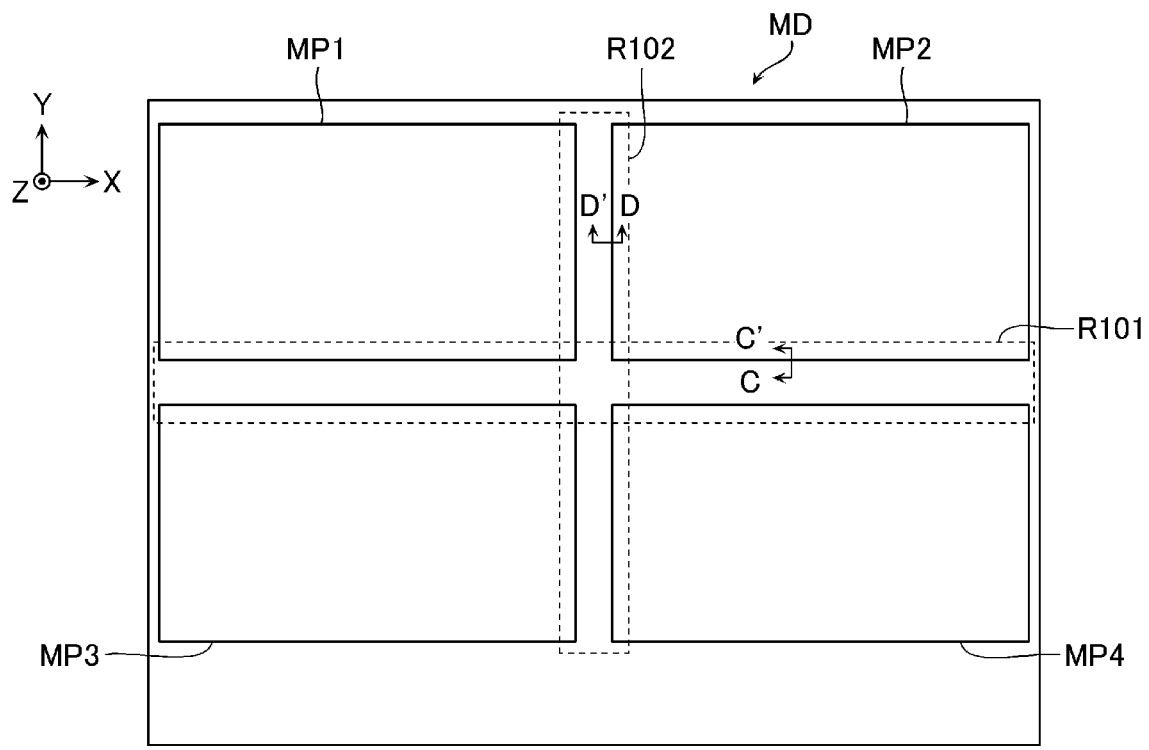
FIG. 8 depicts a memory die of a semiconductor storage device in a schematic plan view according to a first embodiment.

FIG. 8 is a plan view showing the upper surface of each memory die MD, and a back surface side of the chip $C_M$ is depicted. The chip $C_M$ arranged on an upper surface side of the memory die MD has four memory planes MP arranged in the X and Y directions. Here, the memory planes are referred to as memory planes MP1 to MP4. The peripheral circuit areas PCA (FIG. 5) of the chip $C_P$ is arranged below each of the memory planes MP1 to MP4. Here, a region that extends in the X direction from a central position in the Y direction of the memory die MD is referred to as a region R101, and a region that extends in the Y direction from a central position in the X direction of the memory die MD is referred to as a region R102. The region R101 includes a gap region between the memory planes MP1 and MP2 and between the memory planes MP3 and MP4. The region R102 includes a gap region between the memory planes MP1 and MP3 and between the memory planes MP2 and MP4.

Figure 9:
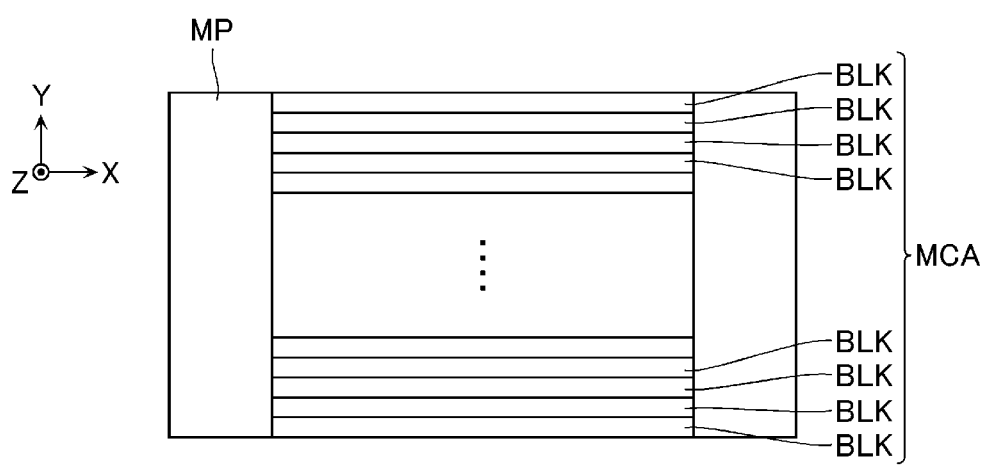
FIG. 9 depicts a memory cell array of a semiconductor storage device in a schematic plan view according to a first embodiment.

Each of the memory planes MP1 to MP4 is provided with the memory cell array MCA as shown in FIG. 9. As described above, the memory cell array MCA includes the plurality of memory blocks BLK arranged in the Y direction.

[Pattern Region in Region R101]

Figure 10:
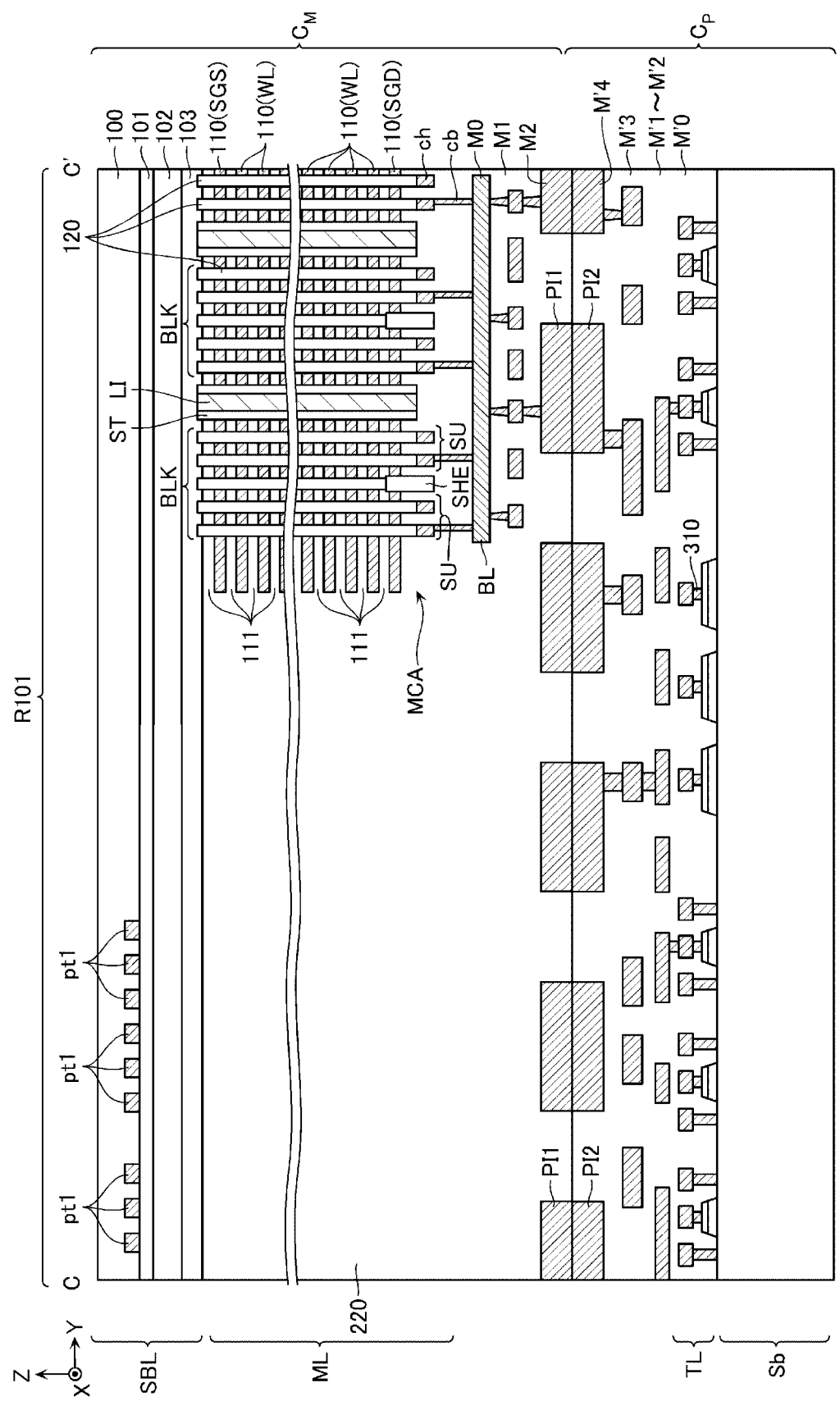
FIG. 10 depicts a memory die of a semiconductor storage device in a schematic cross-sectional view corresponding to a line C-C' in FIG. 8 according to a first embodiment.
Figure 11:
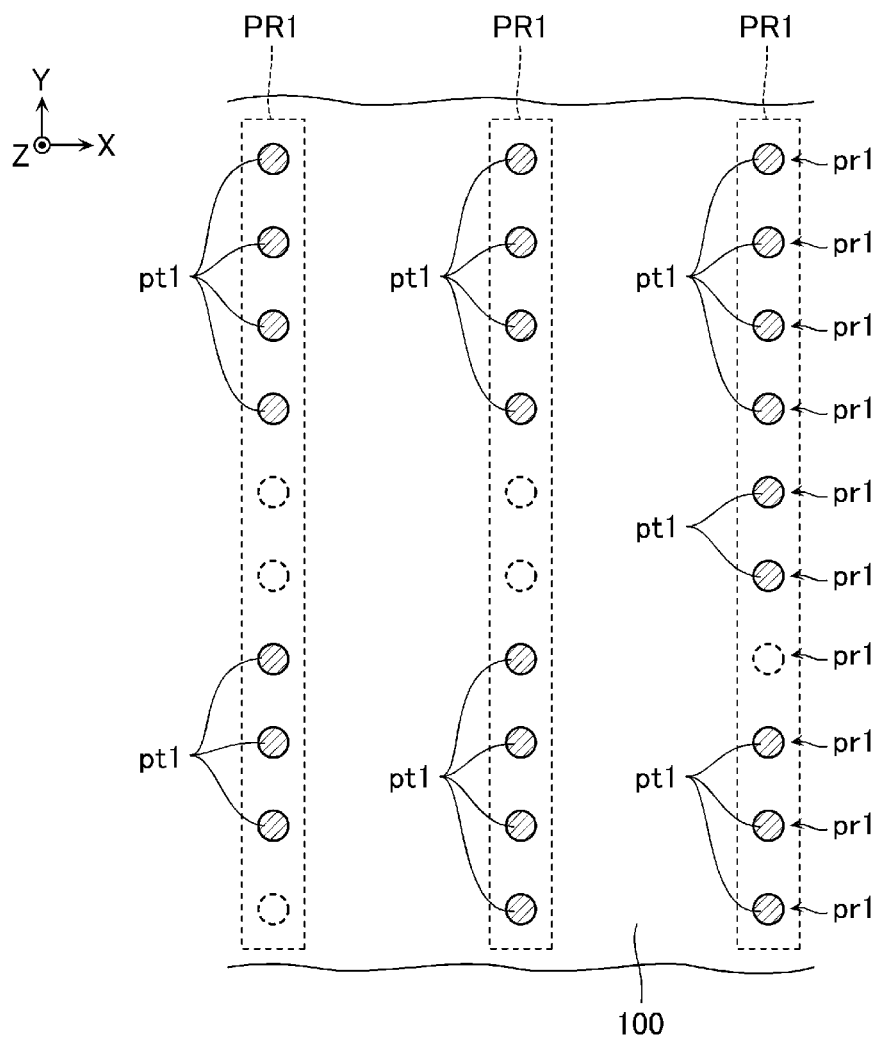
FIG. 11 depicts an XY cross section formed by polishing the memory die shown in FIG. 10 from an upper surface side according to a first embodiment.

FIG. 10 is a schematic cross-sectional view of the memory die MD shown in FIG. 8 obtained by cutting along a line C-C' in the region R101 and viewed in a direction of the arrow. FIG. 11 is a view showing an XY cross section formed by polishing the memory die MD shown in FIG. 10 from the upper surface side.

As shown in FIG. 10, in the region R101, the insulating layer 101 widens along the XY plane, and there exist a part where the memory cell array MCA is arranged below the insulating layer 101 and a part where the memory cell array MCA is not arranged below the insulating layer 101. As shown in FIGS. 10 and 11, a plurality of pattern members pt1 arranged in the X direction and the Y direction are provided on a surface which is a part of an upper surface of the insulating layer 101 in the region R101 and which corresponds to the part where the memory cell array MCA is not arranged below the insulating layer 101. The pattern members pt1 are small block bodies, protrusions, or the like having a circular column shape and including a conductive material such as aluminum (Al). The pattern members pt1 can be provided by forming them at the same time as the back surface wiring MZ (FIG. 7).

As shown in FIG. 11, in the XY cross section including the pattern members pt1, a plurality of pattern regions PR1 that extend in the Y direction are spaced from each other in the X direction. Each pattern region PR1 includes a plurality of small pattern regions pr1 (may also be referred to as pattern elements herein) arranged in the Y direction. In each of the plurality of small pattern regions pr1, a pattern where a pattern member pt1 is arranged indicates "1", and a pattern where no pattern member pt1 is arranged indicates "0". In the example of FIG. 11, a ten-digit binary value is represented by ten small pattern regions pr1. The patterns in the respective pattern regions PR1 are binary number representations (based on whether or not pattern members pt1 are provided or not). Such patterns in the pattern regions PR1 located at different positions in the X direction are all different.

An interval (X direction distance) between adjacent pattern regions PR1 in the X direction may correspond to, for example, a distance of one hundred (100) bit lines BL in the X direction. More specifically, a plurality of bit lines BL that extend in the Y direction and are spaced from each other in the X direction. The plurality of pattern regions PR1 that extend in the Y direction are also spaced from each other in the X direction. If the X direction distance between the adjacent bit lines BL is "1" in such arrangement, then the X direction distance between the adjacent pattern regions PR1 can be "100" for example. That is, spacing distance can be a ratio of 1:100 (bit line spacing distance:pattern region PR1 spacing distance) When the memory die MD is viewed in a state of the plan views shown in FIGS. 8 and 11, for example, an X direction position of a first pattern region PR1 on the righthand side in FIG. 11 corresponds to an X direction position of a first bit line BL, an X direction position of a second pattern region PR1 in the middle in FIG. 11 corresponds to an X direction position of a 101st bit line BL, and an X direction position of a third pattern region PR1 on the left hand side in FIG. 11 corresponds to an X direction position of a 201st bit line BL.

Therefore, when a structure or the like of the memory die MD is physically analyzed, an address position of each bit line BL can be recognized by observing a binary value in each pattern region PR1. In one embodiment, in order to physically analyze the memory die MD, the insulating layer 100 (FIG. 10) provided in the chip $C_M$ of the memory die MD is polished to form a cross section, parallel to the surface of the semiconductor substrate Sb, where at least upper surfaces of the pattern members pt1 are exposed. In such cross section, the binary value in each pattern region PR1 can be observed as shown in FIG. 11, and the address position of the bit line BL can be recognized from the binary value. In another embodiment, by cutting the memory die MD such that a YZ cross section can be observed at the address position of the bit line BL, which is to be analyzed, among the respective positions in the X direction, the YZ cross section appears at the to-be-analyzed address position of the bit line BL. A structure and the like of a memory in such position can be analyzed by observing the YZ cross section with an electron microscope or the like.

In still another embodiment, a ternary number can be represented by each pattern region PR 1 if a pattern where a pattern member pt1 is arranged indicates "1", a pattern where a pattern member having a size half of the pattern member pt1 indicating "1" is arranged indicates "2", and a pattern where no pattern member pt1 is arranged indicates "0". Accordingly, a base-M (where M is an integer equal to or more than 2) number can be represented by arranging pattern members having different sizes.

A shape of each of the pattern members pt1 is not limited to the circular column shape, and various shapes such as a quadrangular prism shape may be adopted. Holes for forming patterns (or pattern holes) may be formed on the upper surface of the insulating layer 101 instead of the pattern members pt1. Such pattern holes can be easily formed at the same time when the insulating layer 101 is formed or after the insulating layer 101 is formed. A conductive layer such as aluminum may be formed on the insulating layer 101, and the pattern holes may be formed in the conductive layer. It is possible to form such pattern holes at the same time as the back surface wiring MZ, and thus the pattern holes can be easily provided. The pattern holes may be formed in the insulating layer 101. In addition, members having different material, material density, and the like from those of the insulating layer 101 may be formed on the upper surface of the insulating layer 101, and patterns may be formed by presence or absence of the members or by presence or absence of pattern holes formed in the members.

While the pattern regions PR1 are arranged on the surface, which is a part of the upper surface of the insulating layer 101 corresponding to the part where the memory cell array MCA is not arranged below the insulating layer 101 as shown in FIGS. 10 and 11 according to the present embodiment, the pattern regions PR1 may be arranged on a surface, which is a part of the upper surface of the insulating layer 101 corresponding to a part where the memory cell array MCA is arranged below the insulating layer 101 according to another embodiment.

[Pattern Region in Region R102]

Figure 12:
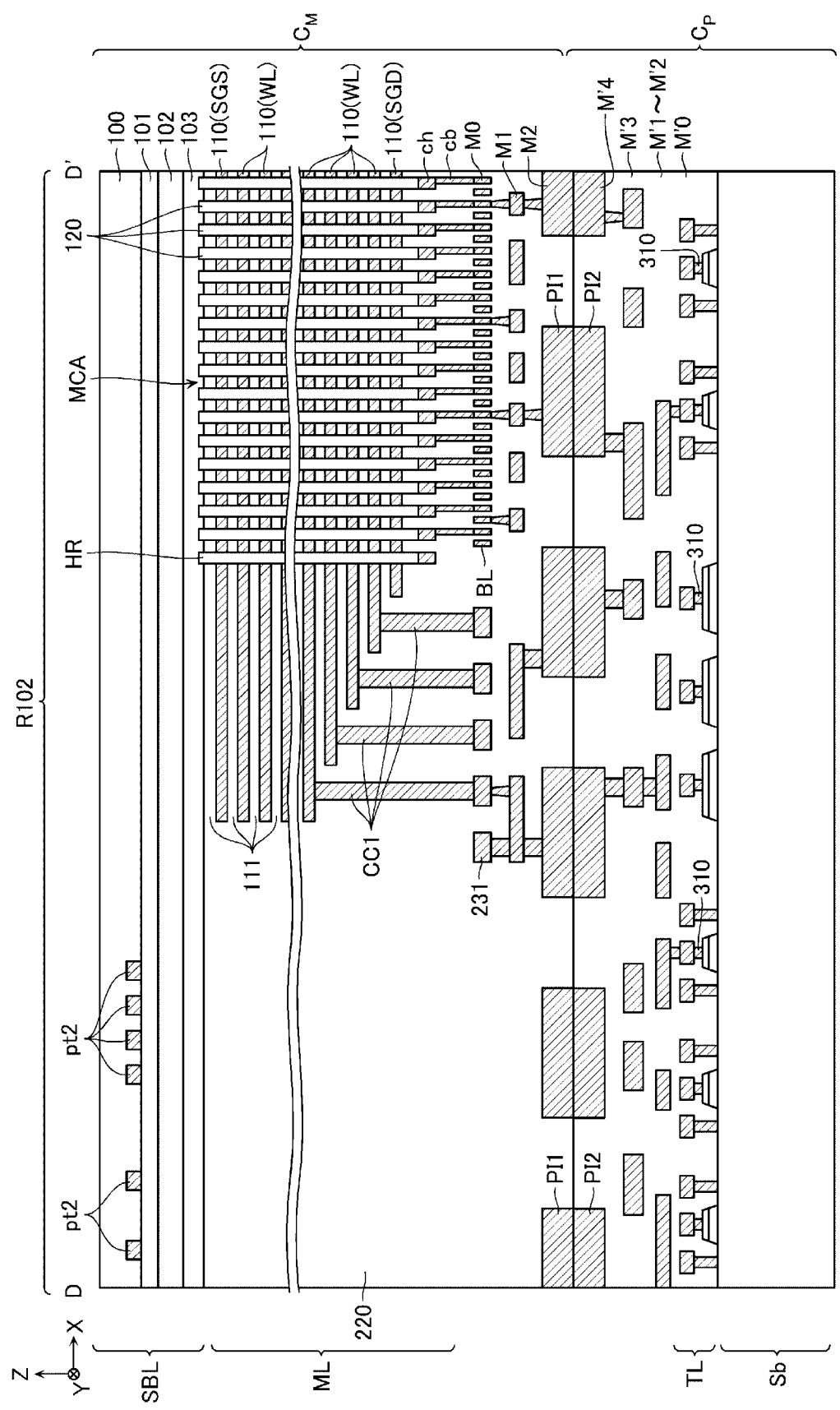
FIG. 12 depicts a memory die of a semiconductor storage device in a schematic cross-sectional view corresponding to a line D-D' in FIG. 8 according to a first embodiment.
Figure 13:
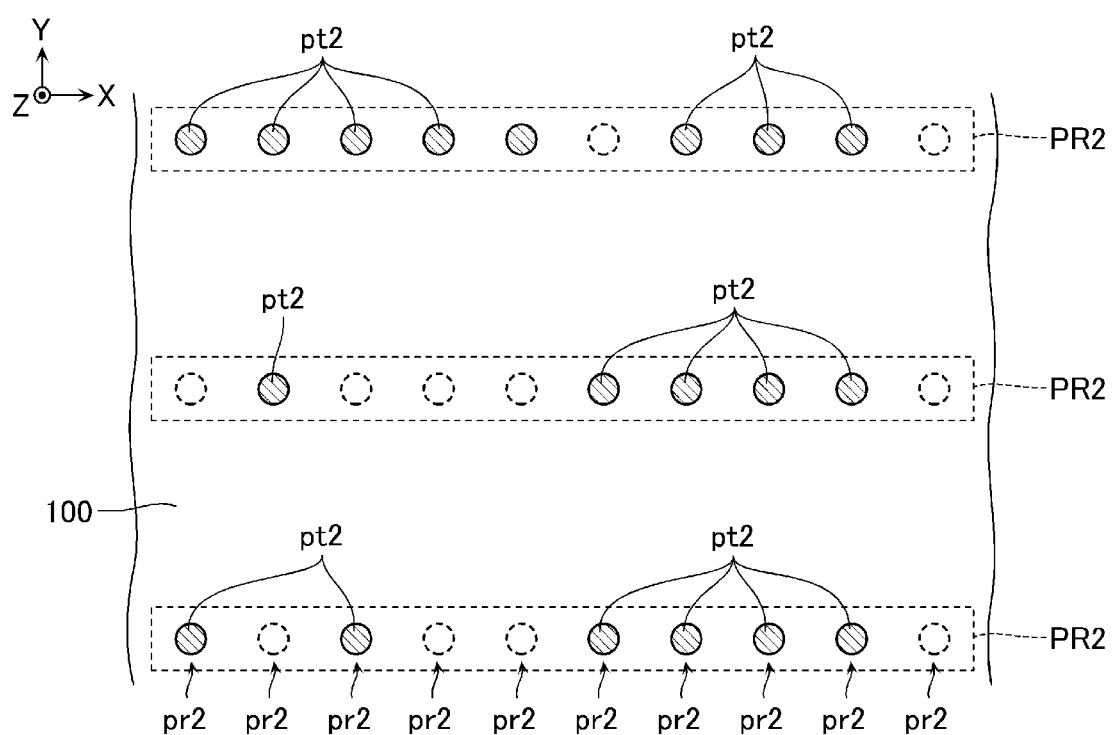
FIG. 13 depicts an XY cross section formed by polishing the memory die MD shown in FIG. 12 from the upper surface side according to a first embodiment.

FIG. 12 is a schematic cross-sectional view of the memory die MD shown in FIG. 8 obtained by cutting along a line D-D' in the region R102 and viewed in a direction of the arrow. FIG. 13 is a view showing an XY cross section formed by polishing the memory die MD shown in FIG. 12 from the upper surface side.

As shown in FIG. 12, in the region R102, the insulating layer 101 widens along the XY plane, and there exist a part where the memory cell array MCA is arranged below the insulating layer 101 and a part where the memory cell array MCA is not arranged below the insulating layer 101. As shown in FIGS. 12 and 13, a plurality of pattern members pt2 arranged in the X direction and the Y direction are provided on the surface which is the part of the upper surface of the insulating layer 101 in the region R102 and which corresponds to the part where the memory cell array MCA is not arranged below the insulating layer 101. The pattern members pt2 are small block bodies having a circular column shape and including a conductive material such as aluminum (Al). The pattern members pt2 can be formed by forming them at the same time as the back surface wiring MZ (FIG. 7).

As shown in FIG. 13, in the XY cross section including the pattern members pt2, a plurality of pattern regions PR2 that extend in the X direction are arranged in parallel to each other in the Y direction. Each pattern region PR2 includes a plurality of small pattern regions pr2 (may also be referred to as pattern elements herein) arranged in the X direction. In each of the plurality of small pattern regions pr2, a pattern where a pattern member pt2 is arranged indicates "1", and a pattern where no pattern member pt2 is arranged indicates "0". In the example of FIG. 13, a ten-digit binary value is represented by ten small pattern regions pr2. The patterns in the respective pattern regions PR2 are binary number representations, (based on whether or not pattern members pt2 are provided or not). Such patterns in the pattern regions PR2 that are located at different positions in the Y direction are all different.

Each pattern region PR2 arranged in the Y direction is provided corresponding to each of the plurality of memory blocks BLK (FIG. 9) arranged in the Y direction. That is, a Y direction position of each pattern region PR2 corresponds to a Y direction position of one memory block BLK among a plurality of (for example, four) memory blocks BLK arranged in the Y direction.

Therefore, when the structure or the like of the memory die MD is physically analyzed, an address position of each memory block BLK can be recognized by observing a binary value in each pattern region PR2. In one embodiment, in order to physically analyze the memory die MD, the insulating layer 100 (FIG. 12) provided in the chip $C_M$ of the memory die MD is polished to form a cross section, parallel to the surface of the semiconductor substrate Sb, where at least upper surfaces of the pattern members pt2 are exposed. In such cross section, the binary value in each pattern region PR2 can be observed as shown in FIG. 13, and the address position of the memory block BLK can be recognized from the binary value. In another embodiment, by cutting the memory die MD such that an XZ cross section can be observed at the address position of the memory block BLK, which is to be analyzed, among the respective positions in the Y direction, the XZ cross section appears at the to-be-analyzed address position of the memory block BLK. A structure and the like of a memory in such position can be analyzed by observing the XZ cross section with an electron microscope or the like.

In still another embodiment, a ternary number can be represented by each pattern region PR 2 if a pattern where a pattern member pt2 is arranged indicates "1", a pattern where a pattern member having a size half of the pattern member pt2 indicating "1" is arranged indicates "2", and a pattern where no pattern member pt2 is arranged indicates "0". Accordingly, a base-N (where N is an integer equal to or more than 2) number can be represented by arranging pattern members having different sizes.

A shape of each of the pattern members pt2 is not limited to the circular column shape, and various shapes such as a quadrangular prism shape may be adopted. Holes for forming patterns (or pattern holes) may be formed on the upper surface of the insulating layer 101 instead of the pattern members pt2. Such pattern holes can be easily formed at the same time when the insulating layer 101 is formed or after the insulating layer 101 is formed. A conductive layer such as aluminum may be formed on the insulating layer 101, and the pattern holes may be formed in the conductive layer. It is possible to form such pattern holes at the same time as the back surface wiring MZ, and thus the pattern holes can be easily provided. The pattern holes may be formed in the insulating layer 101. In addition, members having different material, material density, and the like from those of the insulating layer 101 may be formed on the upper surface of the insulating layer 101, and patterns may be formed by presence or absence of the members or by presence or absence of pattern holes formed in the members.

While the pattern regions PR2 is arranged on the surface, which is a part of the upper surface of the insulating layer 101 corresponding to the part where the memory cell array MCA is not arranged below the insulating layer 101 as shown in FIGS. 12 and 13 according to the present embodiment, the pattern regions PR2 may be arranged on a surface, which is a part of the upper surface of the insulating layer 101 corresponding to a part where the memory cell array MCA is arranged below the insulating layer 101 according to another embodiment.

Second Embodiment

Next, a semiconductor storage device according to a second embodiment will be described. The semiconductor storage device according to the second embodiment is different from the first embodiment in positions of the pattern regions and a pattern formation mode. The other aspects are substantially the same as those of the first embodiment. Therefore, the positions of the pattern regions and the pattern formation mode in the second embodiment will be described below, and repetitive descriptions of other aspects may be omitted.

The second embodiment can also be described with reference to FIG. 8 since the upper surface of the memory die MD in the second embodiment is similar to that in the first embodiment.

[Pattern Region in Region R101]

Figure 14:
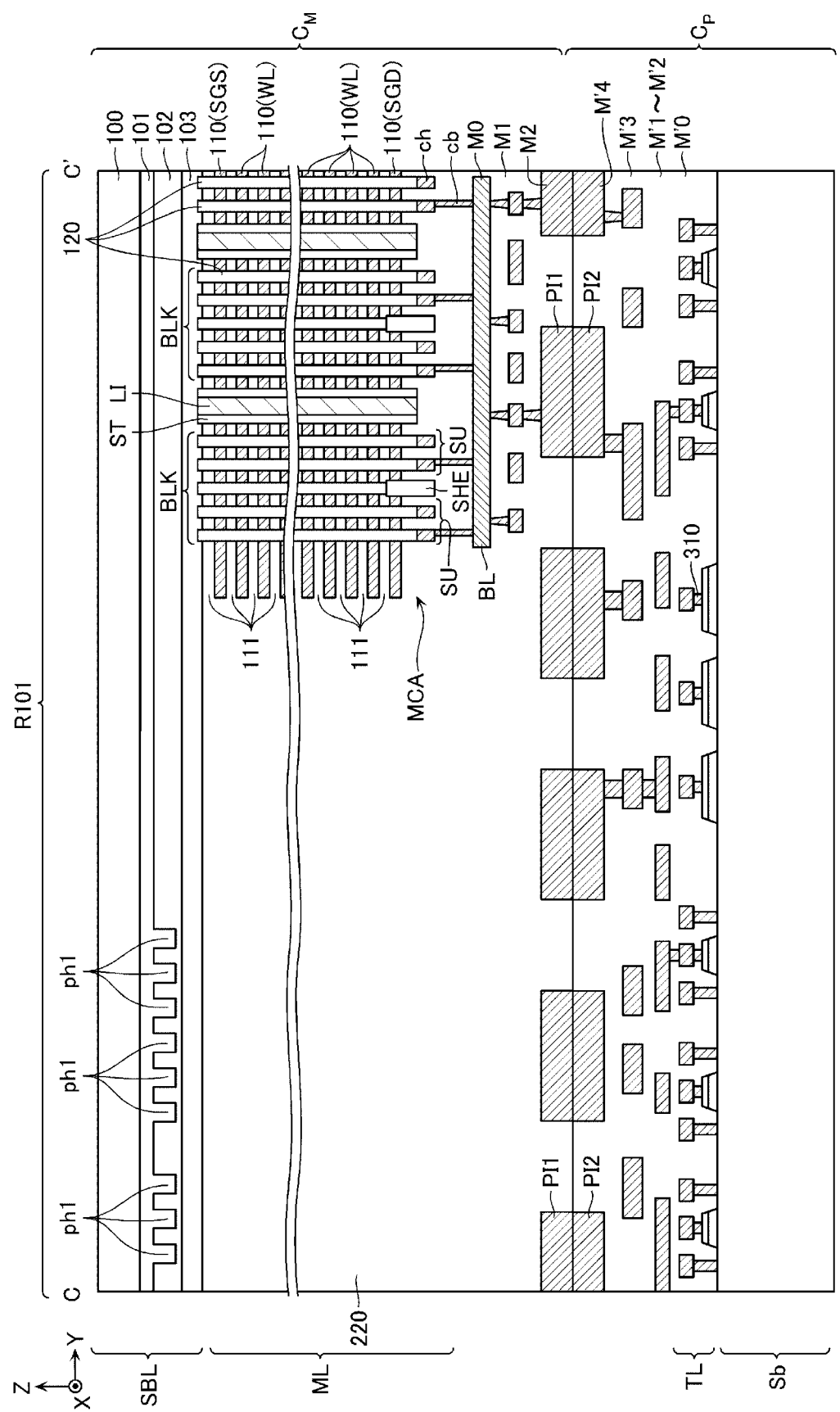
FIG. 14 depicts a part corresponding to the line C-C' in FIG. 8 of a semiconductor storage device in a schematic cross-sectional view according to a second embodiment.
Figure 15:
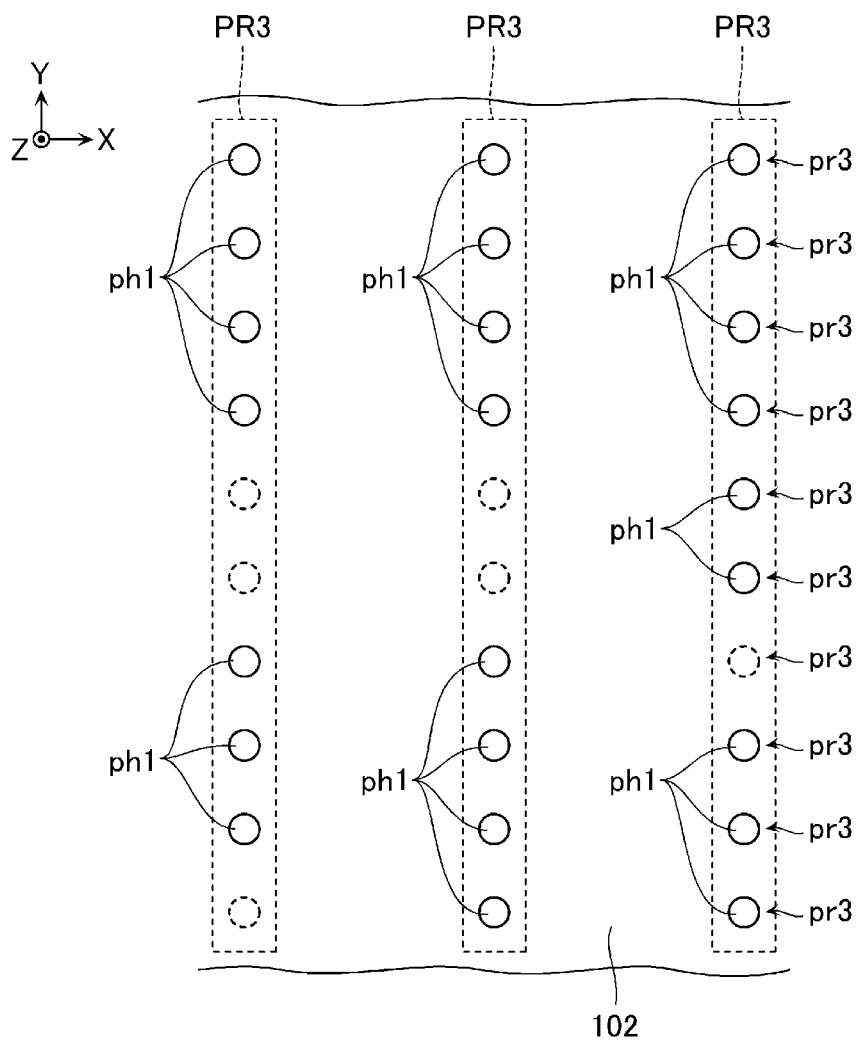
FIG. 15 depicts an XY cross section formed by polishing the memory die shown in FIG. 14 from the upper surface side according to a second embodiment.

FIG. 14 is a schematic cross-sectional view of the memory die MD shown in FIG. 8 obtained by cutting along the line C-C' in the region R101 and viewed in the direction of the arrow. FIG. 15 is a view showing an XY cross section formed by polishing the memory die MD shown in FIG. 14 from the upper surface side.

As shown in FIG. 14, in the region R101, the N-type well layer 102 widens along the XY plane, and there exist a part where the memory cell array MCA is arranged below the N-type well layer 102 and a part where the memory cell array MCA is not arranged below the N-type well layer 102. As shown in FIGS. 14 and 15, a plurality of pattern holes ph1 arranged in the X direction and the Y direction are provided on the surface which is the part of the upper surface of the N-type well layer 102 in the region R101 and which corresponds to the part where the memory cell array MCA is not arranged below the N-type well layer 102. Each pattern hole ph1 is a small cylindrical hole in which an upper surface having a depth in the Z direction formed on the upper surface of the N-type well layer 102 is opened. The pattern holes ph1 may be formed at the same time when the N-type well layer 102 is formed or after the N-type well layer 102 is formed. The pattern holes ph1 are buried by an insulating layer 101. The pattern holes ph1 can be easily provided since the pattern holes ph1 are only formed on the surface of the N-type well layer 102.

As shown in FIG. 15, in the XY cross section including the pattern holes ph1, a plurality of pattern regions PR3 that extend in the Y direction are arranged in parallel to each other at different positions in the X direction. Each pattern region PR3 includes a plurality of small pattern regions pr3 (may also be referred to as pattern elements herein) arranged in the Y direction. In each of the plurality of small pattern regions pr3, a pattern where a pattern hole ph1 is arranged indicates "1", and a pattern where no pattern hole ph1 is arranged indicates "0". In the example of FIG. 15, a ten-digit binary value is represented by ten small pattern regions pr3. The patterns in the respective pattern regions PR3 are binary number representations (based on whether or not pattern holes ph1 are provided or not). Such patterns in the pattern regions PR3 located at different positions in the X direction are all different.

An interval (an X direction distance) between adjacent pattern regions PR3 in the X direction may correspond to, for example, the distance of 100 bit lines BL in the X direction. More specifically, the plurality of bit lines BL that extend in the Y direction are spaced from each other in the X direction. The plurality of pattern regions PR3 that extend in the Y direction are also spaced from each other in the X direction. If the X direction distance between the adjacent bit lines BL is "1" in such arrangement, then the X direction distance between the adjacent pattern regions PR3 can be "100" for example. When the memory die MD is viewed in a state of the plan views shown in FIGS. 8 and 15, for example, an X direction position of a first pattern region PR3 on the righthand side in FIG. 15 corresponds to an X direction position of a first bit line BL, an X direction position of a second pattern region PR3 in the middle in FIG. 15) corresponds to an X direction position of a 101st bit line BL, and an X direction position of a third pattern region PR3 on the left hand side in FIG. 15 corresponds to an X direction position of a 201st bit line BL.

Therefore, when the structure or the like of the memory die MD is physically analyzed, the address position of each bit line BL can be recognized by observing the binary value in each pattern region PR3. In one embodiment, in order to physically analyze the memory die MD, the insulating layer 100 and the insulating layer 101 (FIG. 14) provided in the chip $C_M$ of the memory die MD are polished, and when necessary, the upper surface of the N-type well layer 102 is further polished. This forms a cross section (that is a cross section parallel to the surface of the semiconductor substrate Sb) of the N-type well layer 102 in which the pattern holes ph1 are exposed. In such cross section, the binary value in each pattern region PR3 can be observed as shown in FIG. 15, and the address position of the bit line BL can be recognized from the binary value. In another embodiment, by cutting the memory die MD such that a YZ cross section can be observed at the address position of the bit line BL, which is to be analyzed, among the respective positions in the X direction, the YZ cross section appears at the to-be-analyzed address position of the bit line BL. A structure and the like of a memory in such position can be analyzed by observing the YZ cross section with an electron microscope or the like.

In still another embodiment, a ternary number can be represented by each pattern region PR3 if a pattern where a pattern hole ph1 is arranged indicates "1", a pattern where a pattern hole having a size half of the pattern hole ph1 indicating "1" is arranged indicates "2", and a pattern where no pattern hole ph1 is arranged indicates "0". Accordingly, a base-M (where M is an integer equal to or more than 2) number can be represented by arranging pattern holes having different sizes.

A shape of each of the pattern holes ph1 is not limited to a cylindrical shape, and various shapes such as a quadrangular cylindrical shape may be adopted. Protrusions for forming patterns (or pattern protrusions) may be formed on the upper surface of the N-type well layer 102 instead of the pattern holes ph1. Such pattern protrusions can be formed integrally with the N-type well layer 102. Further, in addition to the pattern holes ph1 and the pattern protrusions, members having different material, material density, and the like from those of the N-type well layer 102 may be formed on the upper surface of the N-type well layer 102, and patterns may be formed by presence or absence of the members or by presence or absence of pattern holes formed in the members.

While the pattern regions PR3 are arranged on the surface, which is a part of the upper surface of the N-type well layer 102 corresponding to the part where the memory cell array MCA is not arranged below the N-type well layer 102 as shown in FIGS. 14 and 15 according to the present embodiment, the pattern regions PR3 may be arranged on a surface, which is a part of the upper surface of the N-type well layer 102 corresponding to a part where the memory cell array MCA is arranged below the N-type well layer 102.

[Pattern Region in Region R102]

Figure 16:
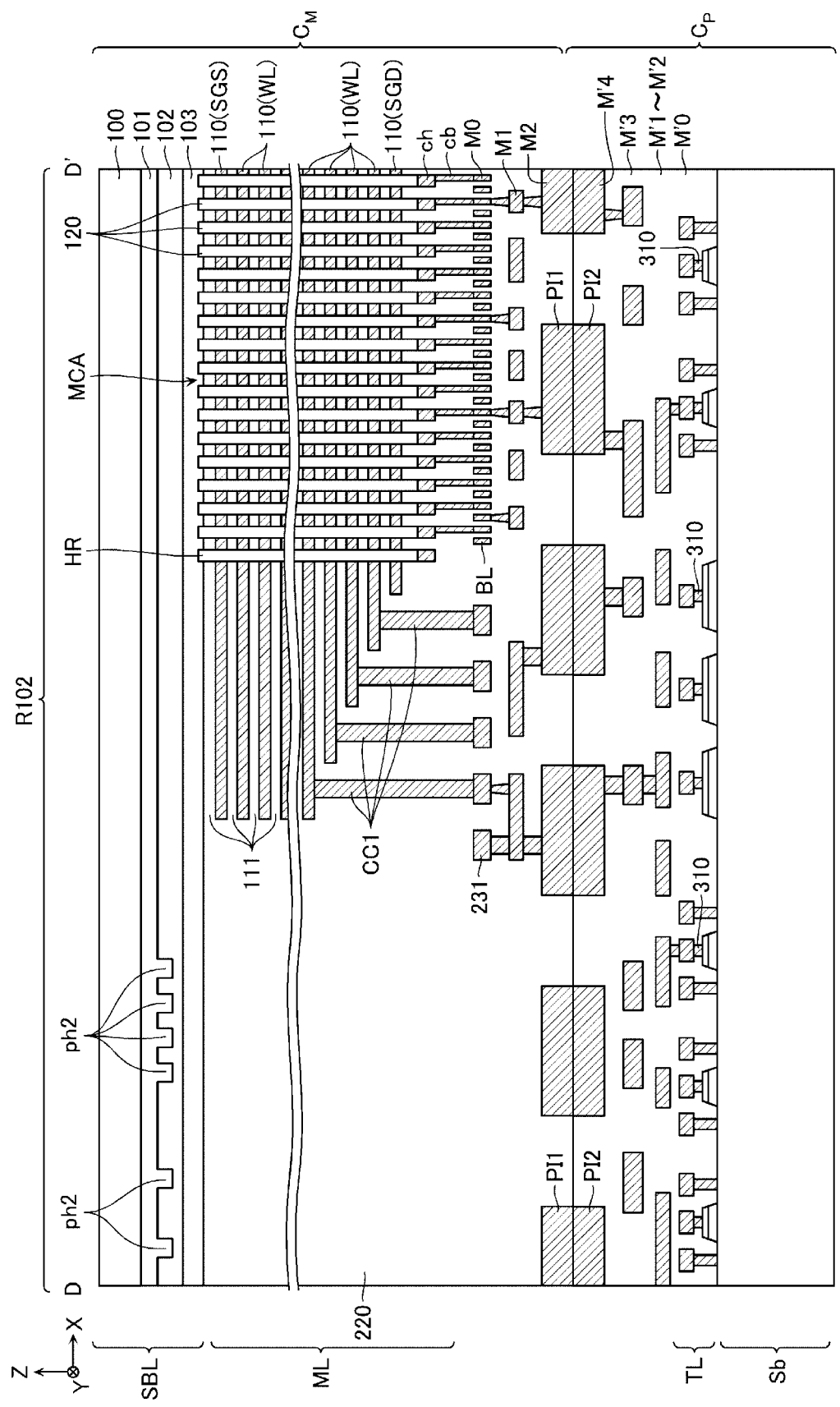
FIG. 16 depicts a part corresponding to the line D-D' in FIG. 8 of the semiconductor storage device in a schematic cross-sectional view according to a second embodiment.
Figure 17:
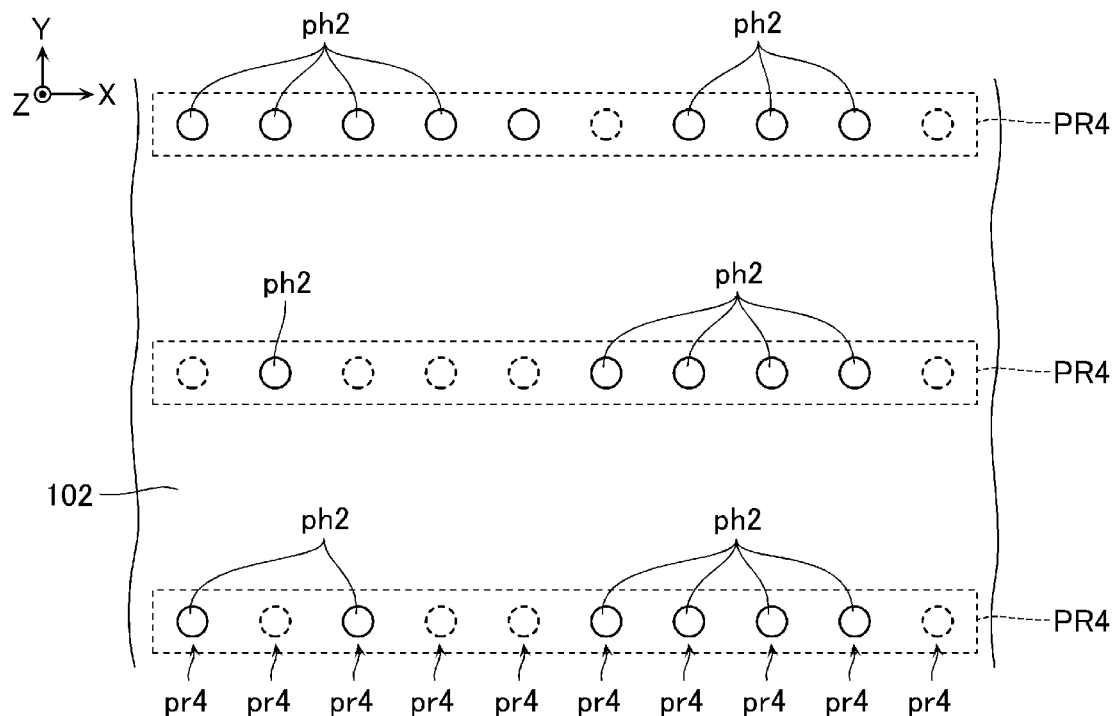
FIG. 17 depicts an XY cross section formed by polishing the memory die shown in FIG. 16 from the upper surface side according to a second embodiment.

FIG. 16 is a schematic cross-sectional view of the memory die MD shown in FIG. 8 obtained by cutting along the line D-D' in the region R102 and viewed in the direction of the arrow. FIG. 17 is a view showing an XY cross section formed by polishing the memory die MD shown in FIG. 16 from the upper surface side.

As shown in FIG. 16, in the region R102, the N-type well layer 102 widens along the XY plane, and there is a part where the memory cell array MCA is below the N-type well layer 102 and a part where the memory cell array MCA is not below the N-type well layer 102. As shown in FIGS. 16 and 17, a plurality of pattern holes ph2 arranged in the X direction and the Y direction are provided on the surface which is the part of the upper surface of the N-type well layer 102 in the region R102 and which corresponds to the part where the memory cell array MCA is not arranged below the N-type well layer 102. Each pattern hole ph2 is a small cylindrical hole in which an upper surface having a depth in the Z direction formed on the upper surface of the N-type well layer 102 is open. The pattern holes ph2 may be formed at the same time when the formation of the N-type well layer 102 is formed or after the N-type well layer 102 is formed. The pattern holes ph2 are buried by an insulating layer 101. The pattern holes ph2 can be easily formed since the pattern holes ph2 are only formed on the surface of the N-type well layer 102.

As shown in FIG. 17, in the XY cross section including the pattern holes ph2, a plurality of pattern regions PR4 that extend in the X direction are arranged in parallel to each other in the Y direction. Each pattern region PR4 includes a plurality of small pattern regions pr4 (may also be referred to as pattern elements herein) arranged in the X direction. In each of the plurality of small pattern regions pr4, a pattern where a pattern hole ph2 is arranged indicates "1", and a pattern where no pattern hole ph2 is arranged indicates "0". In the example of FIG. 17, a ten-digit binary value is represented by ten small pattern regions pr4. The patterns in the respective pattern regions PR4 are used as binary number representations (with values based on whether or not a pattern hole ph2 is or is not provided in each digit/bit location) with each pattern region PR4 located at different positions in the Y direction having a different binary value (that is, pattern of pattern holes ph2).

Each pattern region PR4 arranged in the Y direction is provided corresponding to each of the plurality of memory blocks BLK (FIG. 9) arranged in the Y direction. That is, a Y direction position of each pattern region PR4 corresponds to the Y direction position of one memory block BLK among the corresponding plurality of (for example, four) memory blocks BLK arranged in the Y direction.

Therefore, when the structure or the like of the memory die MD is physically analyzed, an address position of each memory block BLK can be recognized by observing a binary value in each pattern region PR4. In one embodiment, in order to physically analyze the memory die MD, the insulating layer 100 and the insulating layer 101 (FIG. 16) provided in the chip $C_M$ of the memory die MD are polished, and when necessary, the upper surface of the N-type well layer 102 is further polished. This forms a cross section (that is a cross section parallel to the surface of the semiconductor substrate Sb) of the N-type well layer 102 in which the pattern holes ph2 are exposed. In such cross section, the binary value in each pattern region PR4 can be observed as shown in FIG. 17, and the address position of the memory block BLK can be recognized from the binary value. In another embodiment, by cutting the memory die MD such that an XZ cross section can be observed at the address position of the memory block BLK, which is to be analyzed, among the respective positions in the Y direction, the XZ cross section appears at the to-be-analyzed address position of the memory block BLK. A structure and the like of a memory in such position can be analyzed by observing the XZ cross section with an electron microscope or the like.

In still another embodiment, a ternary number can be represented by each pattern region PR 4 if a pattern where pattern hole ph2 is arranged indicates "1", a pattern where a pattern hole having a size half of the pattern hole ph2 indicating "1" is arranged indicates "2", and a pattern where no pattern hole ph2 is arranged indicates "0". Accordingly, a base-N (where N is an integer equal to or more than 2) number can be represented by arranging pattern holes having different sizes.

A shape of each of the pattern holes ph2 is not limited to a cylindrical shape, and various shapes such as a quadrangular cylindrical shape may be adopted.

Protrusions for forming patterns (or pattern protrusions) may be formed on the upper surface of the N-type well layer 102 instead of the pattern holes ph2. Such pattern protrusions can be formed integrally with the N-type well layer 102. Further, in addition to the pattern holes ph2 and the pattern protrusions, members having different material, material density, and the like from those of the N-type well layer 102 may be formed on the upper surface of the N-type well layer 102, and patterns may be formed by presence or absence of the members or by presence or absence of pattern holes formed in the members.

While the pattern regions PR4 are arranged on the surface, which is a part of the upper surface of the N-type well layer 102 corresponding to the part where the memory cell array MCA is not arranged below the N-type well layer 102 as shown in FIGS. 16 and 17 according to the present embodiment, the pattern regions PR4 may be arranged on a surface, which is a part of the upper surface of the N-type well layer 102 corresponding to a part where the memory cell array MCA is arranged below the N-type well layer 102 according to another embodiment.

Third Embodiment

Next, a semiconductor storage device according to a third embodiment will be described. The semiconductor storage device according to the third embodiment is different from the first and second embodiments in positions of the pattern regions and a pattern formation mode. The other aspects are substantially the same as those of the first embodiment and the second embodiment. Therefore, the positions of the pattern regions and the pattern formation mode in the third embodiment will be described below, and repetitive descriptions of other aspects may be omitted.

In a similar manner to the first and second embodiments, each memory die MD of the semiconductor storage device according to the third embodiment is configured by bonding the front surface of the chip $C_M$ on the memory cell array MCA side and the front surface of the chip $C_P$ on the peripheral circuit side, and the chip $C_M$ is arranged below the chip $C_P$.

Figure 18:
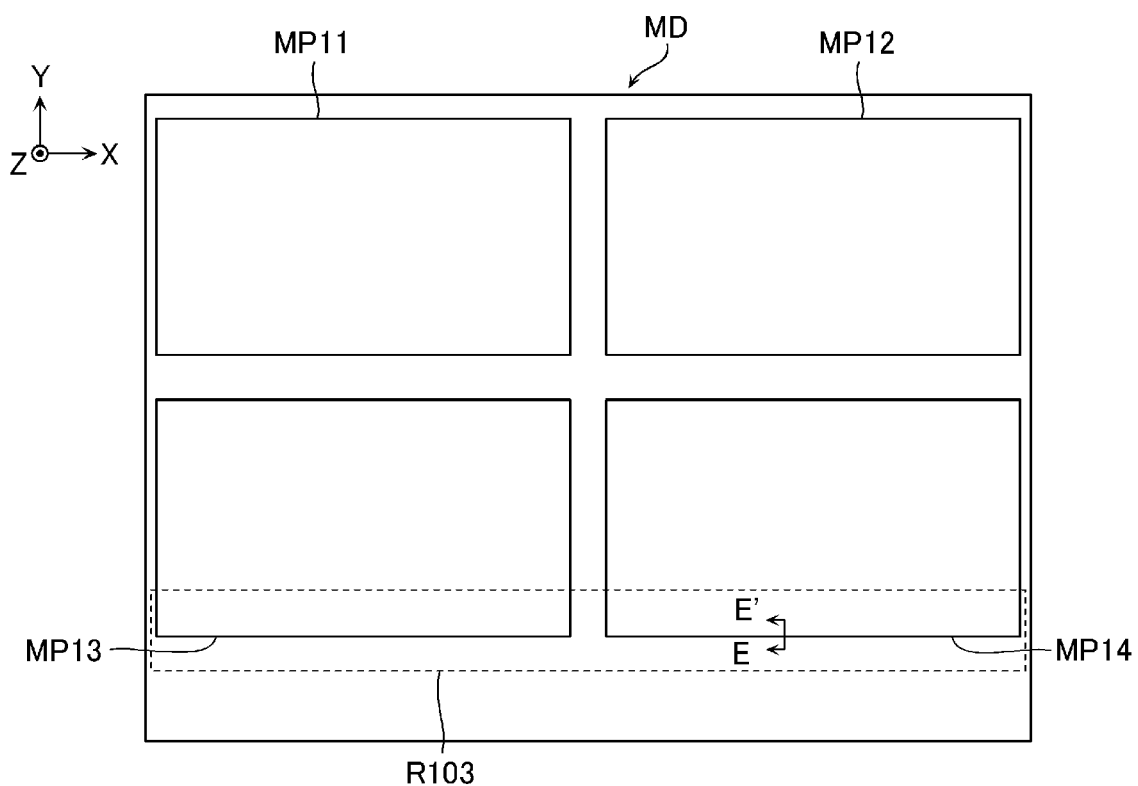
FIG. 18 depicts a memory die of a semiconductor storage device in a schematic plan view according to a third embodiment.

FIG. 18 is a plan view showing the upper surface of each memory die MD, and a back surface side of the chip $C_M$ is depicted, according to the third embodiment. The chip $C_M$ arranged on the upper surface side of the memory die MD has a single or a plurality of memory planes. For example, the chip $C_M$ has four memory planes MP arranged in the X and Y directions. Here, the memory planes are referred to as memory planes MP11 to MP14. The peripheral circuit areas PCA (FIG. 5) of the chip $C_P$ is arranged below the respective memory planes MP11 to MP14. Here, on the upper surface of the memory die MD, a region that extends in the X direction and includes long sides (or lateral sides) of the memory planes MP13 and MP14 on the opposite side to the memory planes MP11 and MP12 is shown with dotted lines and referred to as a region R103.

Figure 19:
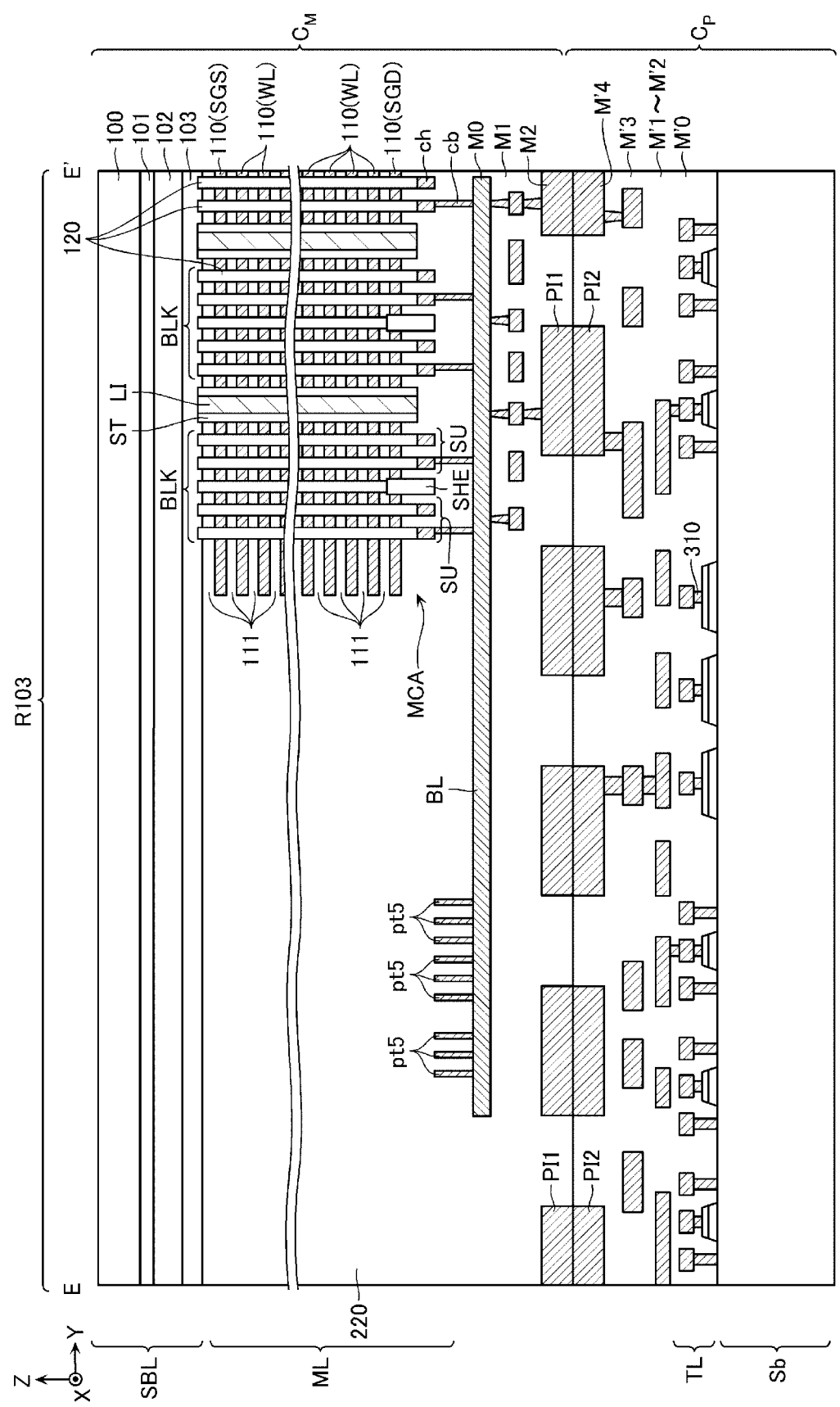
FIG. 19 depicts a memory die of a semiconductor storage device in a schematic cross-sectional view corresponding to a line E-E' in FIG. 18 according to a third embodiment.
Figure 20:
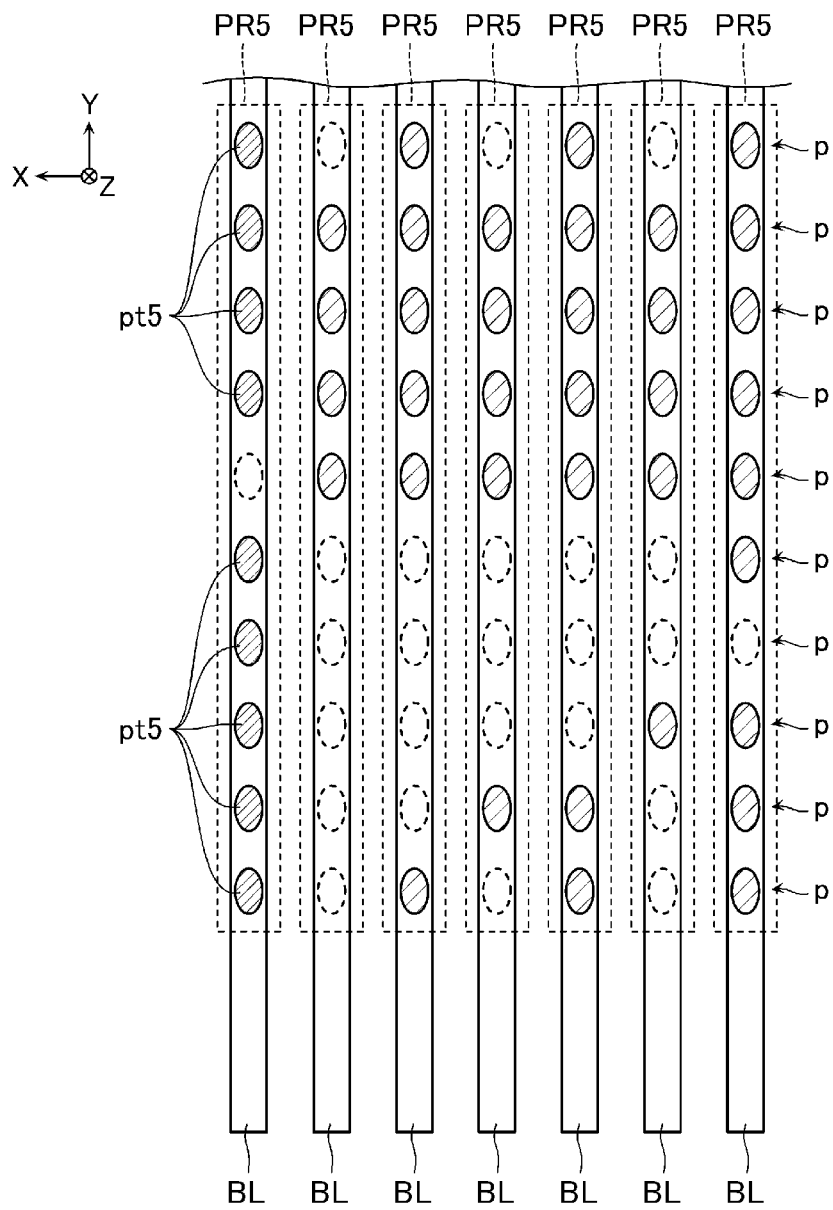
FIG. 20 depicts an XY cross section formed by polishing the memory die shown in FIG. 18 from a lower surface side according to a third embodiment.

FIG. 19 is a schematic cross-sectional view of the memory die MD shown in FIG. 18 obtained by cutting along the line E-E' in the region R103 and viewed in the direction of the arrow. FIG. 20 is a view showing an XY cross section formed by polishing the memory die MD shown in FIG. 18 from the lower surface side.

As shown in FIGS. 19 and 20, a plurality of bit lines BL extending in the Y direction are arranged in parallel to each other in the X direction. A plurality of pattern members pt5 are arranged in the Y direction on the upper surface of the bit lines BL in the region R103. The pattern members p5 are not connected to the semiconductor pillars 120 of the memory cell array MCA via contacts cb or the like. The pattern members pt5 are, for example, small block bodies having an elliptic circular column shape and including a conductive material such as copper (Cu). The pattern members pt5 can be formed at the same time as the bit lines BL and the contacts cb.

As shown in FIG. 20, a plurality of pattern regions PR5 that extend in the Y direction are arranged in parallel to each other in the X direction in the XY plane including the pattern members pt5. Each of the pattern regions PR5 is arranged for each bit line BL. The pattern regions PR5 and the bit lines BL correspond in a one-to-one manner.

Each pattern region PR5 includes a plurality of small pattern regions pr5 (may also be referred to as pattern elements herein) arranged in the Y direction. In each of the plurality of small pattern regions pr5, when a pattern member pt5 is present, this indicates a "1" value, and when no pattern member pt5 is present, this indicates a "0" value. In the example of FIG. 20, a ten-digit binary value is thus represented by ten small pattern regions pr5. The patterns in the respective pattern regions PR5 are therefore binary number representations (with bit/digit values based on whether or not a pattern member pt5 is present). The patterns in the pattern regions PR5 located at different positions in the X direction are all set to be different.

As described above, the pattern regions PR5 having different patterns are arranged on the upper surfaces of the bit lines BL.

Therefore, when the structure or the like of the memory die MD is physically analyzed, the address position of each bit line BL can be recognized by observing a binary value in each pattern region PR5. In one embodiment, in order to physically analyze the memory die MD, the chip $C_P$ of the memory die MD is polished from the lower side thereof, and the chip $C_M$ is polished from the front surface side (that is the lower side facing the chip $C_P$) thereof. This forms a cross section, parallel to the surface of the semiconductor substrate Sb, where the pattern members pt5 are exposed. In such cross section, the binary value in each pattern region PR5 can be observed as shown in FIG. 20, and the address position of each bit line BL can be recognized from the binary value. In another embodiment, by cutting the memory die MD such that a YZ cross section can be observed at the address position of the bit line BL, which is to be analyzed, among the respective positions in the X direction, the YZ cross section appears at the to-be-analyzed address position of the bit line BL. A structure and the like of a memory in such position can be analyzed by observing the YZ cross section with an electron microscope or the like.

In still another embodiment, a ternary number can be represented by each pattern region PR5 if a pattern where a pattern member pt5 is arranged indicates "1", a pattern where a pattern member having a size half of the pattern member pt5 indicating "1" is arranged indicates "2", and a pattern where no pattern member pt5 is arranged indicates "0". Accordingly, a base-M (where M is an integer equal to or more than 2) number can be represented by arranging pattern members having different sizes.

A shape of each of the pattern members pt5 is not limited to the elliptic circular column shape, and various shapes such as the quadrangular prism shape may be adopted.

Fourth Embodiment

Next, a semiconductor storage device according to a fourth embodiment will be described. Each memory die MD of the semiconductor storage device according to the fourth embodiment is configured by bonding the front surface of the chip $C_M$ on the memory cell array side and the front surface of the chip $C_P$ on the peripheral circuit side in a similar to those in the first, second and third embodiments. The chip $C_M$ is arranged below the chip $C_P$ in the fourth embodiment while the same is arranged above the chip $C_P$ in the first, second and third embodiments.

Figure 21:
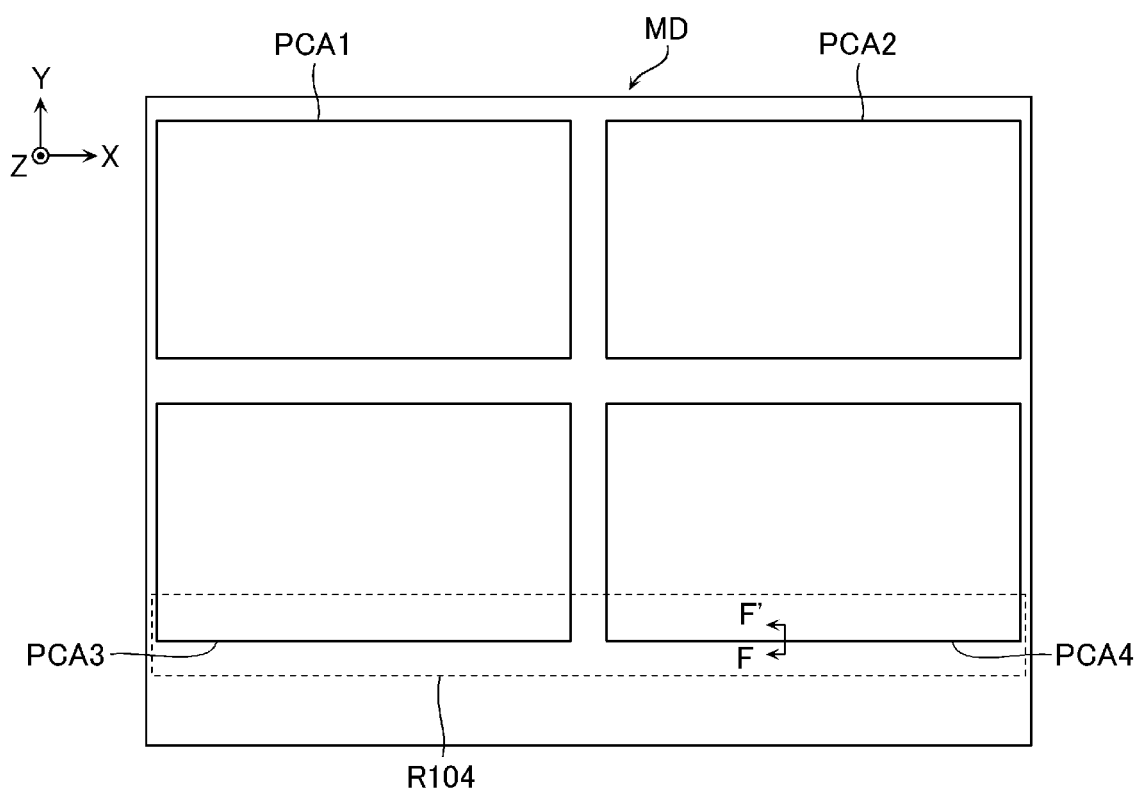
FIG. 21 depicts a memory die of a semiconductor storage device in a schematic plan view according to a fourth embodiment.

FIG. 21 is a plan view showing the upper surface of each memory die MD, and a back surface side of the chip $C_P$ is depicted, according to the fourth embodiment. The chip $C_P$ arranged on the upper surface side of the memory die MD has a single or a plurality of peripheral circuit areas PCA. For example, the chip $C_P$ has four peripheral circuit areas PCA arranged in the X and Y directions. Here, the peripheral circuit regions are referred to as peripheral circuit areas PCA1 to PCA4. The memory planes MP (FIG. 4) of the chip $C_M$ are respectively arranged below the peripheral circuit areas PCA1 to PCA4. Here, on the upper surface of the memory die MD, a region that extends in the X direction and includes long sides (or lateral sides) of the peripheral circuit areas PCA3 and PCA4 on the opposite side to the peripheral circuit areas PCA1 and PCA2 is shown with dotted lines and referred to as a region R104.

Figure 22:
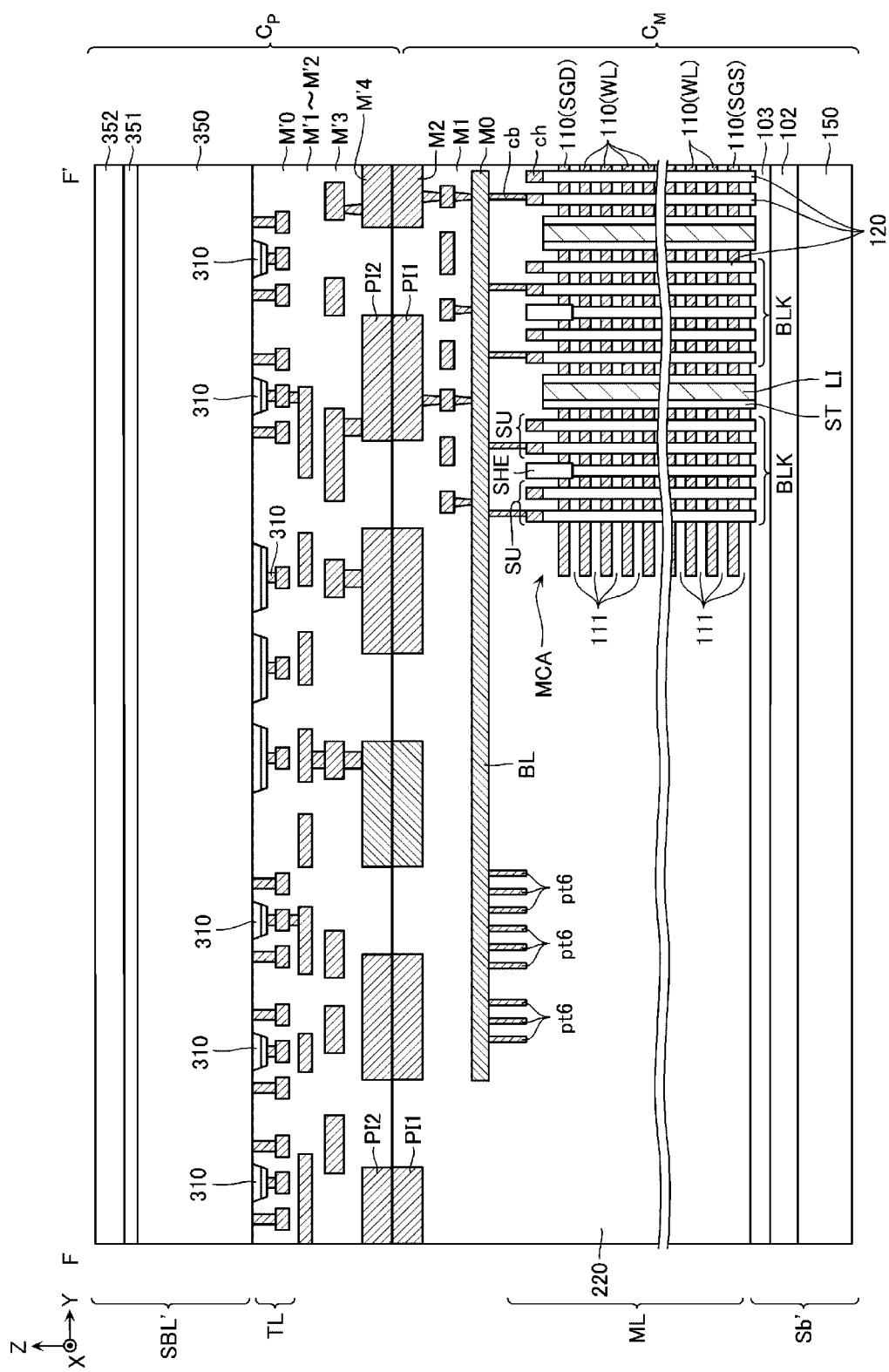
FIG. 22 depicts a memory die of a semiconductor storage device in a schematic cross-sectional view corresponding to a line F-F' in FIG. 21 according to a fourth embodiment.
Figure 23:
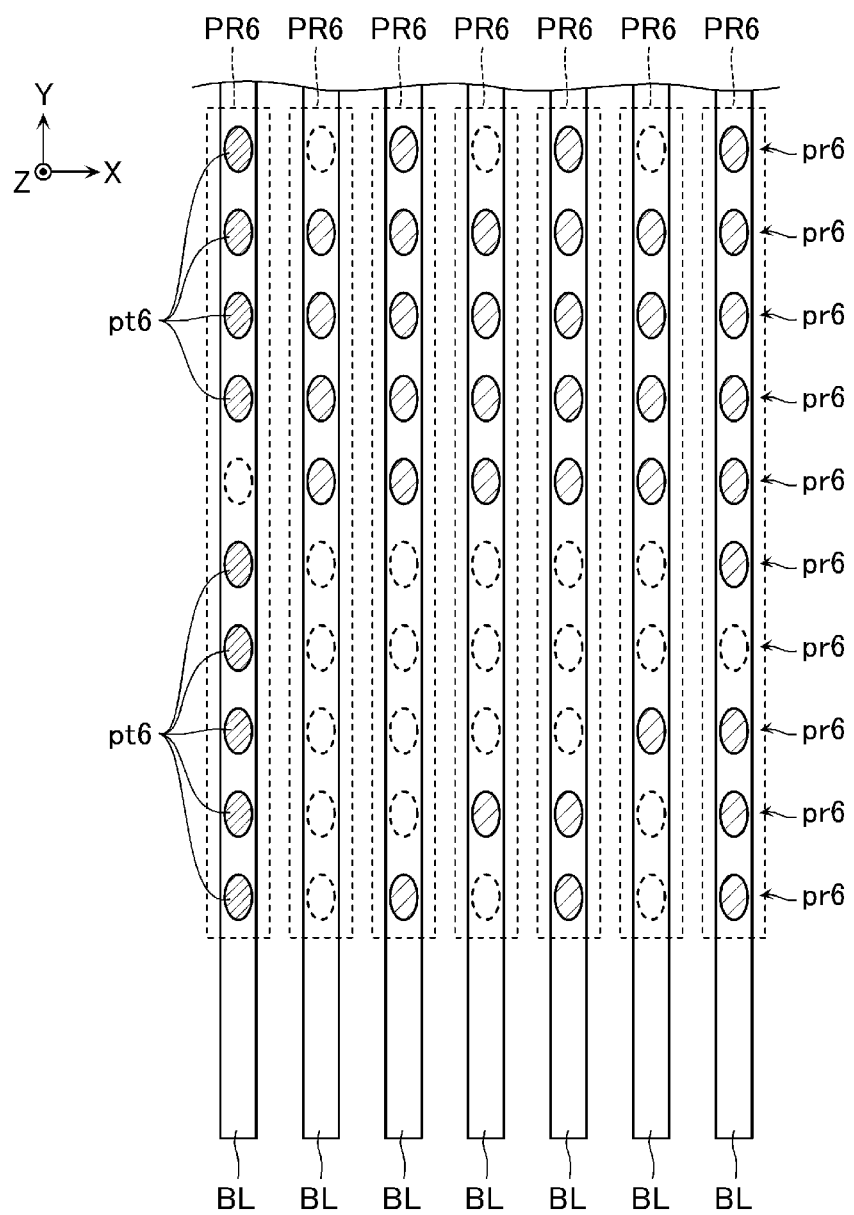
FIG. 23 depicts an XY cross section formed by polishing the memory die shown in FIG. 21 from the upper surface side according to a fourth embodiment.

FIG. 22 is a schematic cross-sectional view of the memory die MD shown in FIG. 21 obtained by cutting along the line F-F' in the region R104 and viewed in the direction of the arrow. FIG. 23 is a view showing an XY cross section formed by polishing the memory die MD shown in FIG. 22 from the upper surface side thereof.

As shown in FIG. 22, in the fourth embodiment, the chip $C_P$ is arranged on the chip $C_M$.

In the chip $C_M$, the memory layer ML is provided on a semiconductor substrate Sb'. The semiconductor substrate Sb' includes a semiconductor region 150, the N-type well layer 102 provided above the semiconductor region 150, and the P-type well layer 103 provided above the N-type well layer 102. The configurations of other portions including the memory layer ML and the wiring layers M0, M1 and M2 of the chip $C_M$ in the fourth embodiment are substantially the same as or similar to those in the first, second and third embodiments, except that they are arranged upside down.

In the chip $C_P$, a base layer SBL' is provided on the transistor layer TL. The base layer SBL' includes a semiconductor substrate 350, an insulating layer 351 provided above the semiconductor substrate 350, and an insulating layer 352 provided above the insulating layer 351. The insulating layer 351 is, for example, an insulating layer made of an insulating material such as silicon oxide ($SiO_2$). The insulating layer 352 is, for example, a passivation layer made of an insulating material such as polyimide. The transistor 310 and the like are provided on a lower surface of the semiconductor substrate 350. The configurations of other portions including the transistor layer TL and the wiring layers M'0, M'1, M'2, M'3 and M'4 of the chip $C_P$ in the fourth embodiment are substantially the same as or similar to those in the first, second and third embodiments, except that they are arranged upside down.

As shown in FIGS. 22 and 23, a plurality of bit lines BL extending in the Y direction are arranged in parallel to each other in the X direction. A plurality of pattern members pt6 are arranged in the Y direction on a lower surface of each of the bit lines BL in the region R104 (FIG. 21). The pattern members pt6 are not connected to the semiconductor pillars 120 of the memory cell array MCA via contacts cb or the like. The pattern members pt6 are, for example, small block bodies having an elliptic circular column shape and including a conductive material such as copper (Cu). The pattern members pt6 can be easily provided by forming them at the same time as the bit lines BL and the contacts cb.

As shown in FIG. 23, a plurality of pattern regions PR6 that extend in the Y direction are arranged in parallel to each other in the X direction in the XY cross section including the pattern members pt6. Each of the pattern regions PR6 is arranged for each bit line BL. The pattern regions PR6 and the bit lines BL correspond in a one-to-one manner.

Each pattern region PR6 includes a plurality of small pattern regions pr6 (may also be referred to as pattern elements herein) arranged in the Y direction. In each of the plurality of small pattern regions pr6, a pattern where a pattern member pt6 is arranged indicates "1", and a pattern where no pattern member pt6 is arranged indicates "0". In the example of FIG. 23, a ten-digit binary value is represented by ten small pattern regions pr6. The patterns in the respective pattern regions PR6 are binary number representations (based on whether or not pattern members pt6 are provided in the small pattern regions pr6). Such patterns in the pattern regions PR6 located at different positions in the X direction are all different.

As described above, the pattern regions PR6 having different patterns are arranged on the lower surfaces of the bit lines BL.

Therefore, when the structure or the like of the memory die MD is physically analyzed, the address position of each bit line BL can be recognized by observing a binary value in each pattern region PR6. In one embodiment, in order to physically analyze the memory die MD, the chip $C_P$ of the memory die MD is polished from the upper side thereof, and the chip $C_M$ is polished from the front surface side (that is the upper side facing the chip $C_P$ side) thereof. This forms a cross section, parallel to the surface of the semiconductor substrate 350, where the pattern members pt6 are exposed. In such cross section, the binary value in each pattern region PR6 can be observed as shown in FIG. 23, and the address position of each bit line BL can be recognized from the binary value. In another embodiment, by cutting the memory die MD such that a YZ cross section can be observed at the address position of the bit line BL, which is to be analyzed, among the respective positions in the X direction, the YZ cross section appears at the to-be-analyzed address position of the bit line BL. A structure and the like of a memory in such position can be analyzed by observing the YZ cross section with an electron microscope or the like.

In still another embodiment, a ternary number can be represented by each pattern region PR6 if a pattern region where a pattern member pt6 is arranged indicates a "1" value, a pattern region where a pattern member having a size half of the pattern member pt6 indicating a "1" value is indicates a "2" value, and a pattern region where no pattern member pt6 is provided indicates a "0" value. Accordingly, a base-M (where M is an integer equal to or more than 2) number can be represented by arranging pattern members having different sizes.

A shape of each of the pattern members pt6 is not limited to the elliptic circular column shape, and various shapes such as the quadrangular prism shape may be adopted.

In a modified version of the fourth embodiment, in a similar manner to the first embodiment (FIGS. 10 to 13), an address position of each bit line BL and an address position of each memory block BLK can be recognized by properly arranging the pattern members on the upper surface of the insulating layer 351. For example, a plurality of pattern regions that extend in the Y direction are arranged in parallel to each other in the X direction on the upper surface of the insulating layer 351, and the address position of each bit line BL can be recognized by including different patterns in each pattern region. Further, a plurality of pattern regions that extend in the X direction are arranged in parallel with each other in the Y direction on the upper surface of the insulating layer 351, and the address position of each memory block BLK can be recognized by including different patterns in each pattern region.

In a modified version of the fourth embodiment, in a similar manner to the second embodiment (FIGS. 14 to 17), an address position of each bit line BL and an address position of each memory block BLK can be recognized by arranging pattern holes on the upper surface of the semiconductor substrate 350. For example, a plurality of pattern regions that extend in the Y direction are arranged in parallel to each other in the X direction on the upper surface of the semiconductor substrate 350, and the address position of each bit line BL can be recognized by including different patterns in each pattern region. A plurality of pattern regions that extend in the X direction are spaced from each other in the Y direction on the upper surface of the semiconductor substrate 350, and thus the address position of each memory block BLK can be recognized by including different patterns within each pattern region.

[Others]

While certain embodiments have been described, these embodiments have been presented by way of example only and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
    a first chip including:
        a semiconductor substrate; and
        a plurality of transistors on the semiconductor substrate; and
    a second chip including:
        a memory cell array connected to the plurality of transistors of the first chip, and including a plurality of memory blocks spaced from each other in a first direction; and
        a plurality of first patterns spaced from each other in the first direction, each first pattern representing a different number and being at a position corresponding to one or more of the memory blocks.

2. The semiconductor storage device according to claim 1, wherein
    each first pattern represents a base-N number, where N is an integer greater than or equal to 2, the base-N number corresponds to an address of the one or more memory blocks corresponding to the position of the respective first pattern, and
    the first patterns each include a plurality of pattern elements corresponding to digits of the base-N number.

3. The semiconductor storage device according to claim 1, wherein the first chip and the second chip are bonded to each other.

4. The semiconductor storage device according to claim 1, wherein
    the first chip comprises a plurality of peripheral circuit areas, at least one of the peripheral circuit areas containing at least one of the transistors, and
    the second chip comprises a plurality of memory planes corresponding to the plurality of peripheral circuit areas of the first chip, at least one of the memory planes including the memory cell array.

5. The semiconductor storage device according to claim 1, wherein the plurality of first patterns comprises a plurality of pattern elements spaced from each other in a second direction crossing the first direction.

6. The semiconductor storage device according to claim 1, wherein each first pattern region includes a pattern element that is a protrusion or a hole.

* * * * *